US008349539B2

(12) United States Patent
Chou et al.

(10) Patent No.: US 8,349,539 B2
(45) Date of Patent: Jan. 8, 2013

(54) PHOTOSENSITIVE POLYMIDES

(75) Inventors: Meng-Yen Chou, Kaohsiung (TW); Chuan-Zong Lee, Kaohsiung (TW)

(73) Assignee: Eternal Chemical Co., Ltd., Kaohsiung (TW)

( * ) Notice: Subject to any disclaimer, the term of this patent is extended or adjusted under 35 U.S.C. 154(b) by 0 days.

(21) Appl. No.: 12/461,152

(22) Filed: Aug. 3, 2009

(65) Prior Publication Data
US 2010/0086874 A1 Apr. 8, 2010

(30) Foreign Application Priority Data

Oct. 8, 2008 (TW) ............... 97138725 A

(51) Int. Cl.
C08G 73/10 (2006.01)
G03F 7/027 (2006.01)
G03F 7/038 (2006.01)
C08F 222/40 (2006.01)

(52) U.S. Cl. ............... 430/284.1; 430/283.1; 430/287.1; 522/96; 522/99; 522/164; 525/422

(58) Field of Classification Search .................. None
See application file for complete search history.

(56) References Cited

U.S. PATENT DOCUMENTS 4,828,948 A * 5/1989 Ahne et al. ............ 430/18
4,883,730 A * 11/1989 Ahne et al. ............ 430/18

FOREIGN PATENT DOCUMENTS

DE 4233532 a1 * 4/1994
FR 2723099 A1 * 2/1996

OTHER PUBLICATIONS

Rames-Langlade et al, Polymer. vol. 18, No. 19 pp. 4965-4972, year 1997, elsevier Science,LTD no month given.*
English translation of FR 2723099 a1 , ten pages generated Nov. 28, 2010 from http://translationgateway.epo.org. of European Patent Office.*
AN 1996:318463, CAPLUS, ACS on STN, Abstract of FR 2723099 entered into STN May 31, 1996, 4 pages.*

* cited by examiner

*Primary Examiner* — Cynthia Hamilton
(74) *Attorney, Agent, or Firm* — Bacon & Thomas, PLLC

(57) ABSTRACT

The invention pertains to an isocyanate-modified photosensitive polyimide. The photosensitive polyimide of the invention possesses excellent heat resistance, chemical resistance and flexibility, and can be used in a liquid photo resist composition or dry film photo resist composition, or used in a solder resist, coverlay film, or printed wiring board.

14 Claims, No Drawings

PHOTOSENSITIVE POLYIMIDES

FIELD OF THE INVENTION

The invention relates to an isocyanate-modified photosensitive polyimide. The photosensitive polyimide of the invention possesses excellent heat resistance, chemical resistance and flexibility, and can be used in a liquid photo resist composition or dry film photo resist composition, or used in a solder resist, coverlay film, or printed wiring board.

BACKGROUND OF THE INVENTION

Electronic products recently have more and more miniaturized and lighter in weight. In accordance with this, various electronic parts are required to be downsized. Based on the ground that flexible printed wiring boards have the advantage of flexibility and light weight, their demand greatly increases.

With respect to the materials used, coverlay films can be divided into the following three types: photosensitive coverlay film (first type), non-photosensitive coverlay film (second type) and thermal plastic coverlay film (third type). The photosensitive coverlay film (first type) also can be divided into polyimide based coverlay film (PI based coverlay film) and non-polyimide based coverlay film (non-PI based coverlay film). Since the non-PI based coverlay film has poor heat resistance, higher coefficient of thermal expansion (CTE), etc., hence its applications are more restricted. The non-photosensitive coverlay film (second type) is more complex in process than is the photosensitive coverlay film (first type), and thus the practicability of the non-photosensitive coverlay film is inferior to that of the photosensitive coverlay film. As for the thermal plastic coverlay film, a holes-formation operation as a post-process is needed, and therefore in the respect of the convenience, the thermal plastic coverlay film is inferior to the photosensitive coverlay film.

U.S. Pat. No. 6,605,353 has disclosed an epoxy-modified photosensitive polyimide. The epoxy-modified photosensitive polyimide is prepared by reacting an epoxide with an acid. However, based on the ground that OH functional groups generated after ring-opening reaction can then react with epoxy groups, the epoxy-modified photosensitive polyimide accordingly has the problems of storage-stability and heat-stability.

In order to improve the heat resistance and process convenience, there is a desire to find a novel photosensitive polyimide which can overcome the above-mentioned problems.

SUMMARY OF THE INVENTION

The invention provides an isocyanate-modified photosensitive polyimide, which possesses excellent stability and heat stability, and in addition can be cured at a low temperature.

The invention further provides a photosensitive composition comprising the photosensitive polyimide mentioned above, which can be used as a protective film material or can be used in a photo resist composition. The film formed from the photosensitive composition of the invention possesses excellent electrical properties, heat resistance, flexibility and chemical resistance. As a consequence, the photosensitive composition of the invention can be used in a solder resist for a protective film material, a coverlay film and a printed circuit board.

DETAILED DESCRIPTION OF THE INVENTION

The photosensitive polyimide of the invention has a structure represented by formula (I):

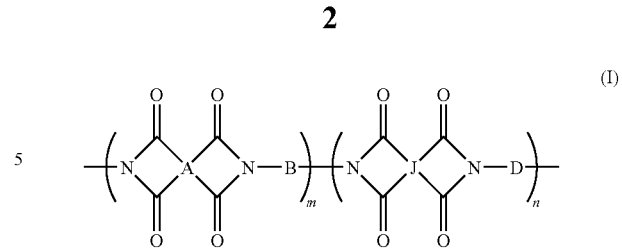

wherein
B and D are the same or different, and each independently is a divalent organic group;
A is a tetravalent organic group containing at least one modifying group R', J is a tetravalent organic group without a modifying group R', n is an integer of 0 or greater than 0, and m is an integer of greater than 0.
R' is selected from the following groups:

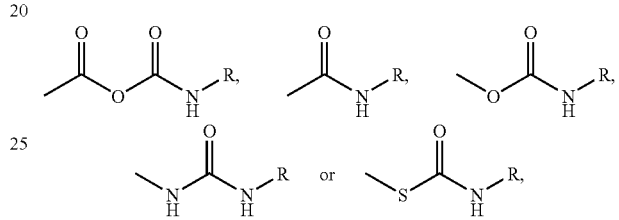

wherein R is a vinyl-containing unsaturated group or is a group selected from:

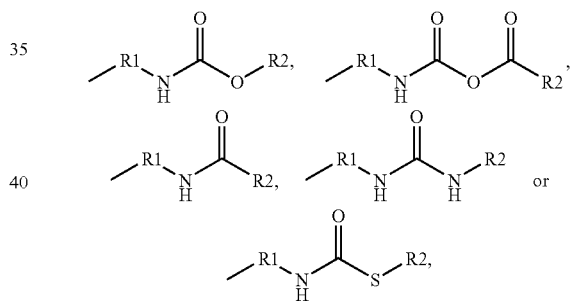

wherein
R1 is a substituted or unsubstituted C1-C20 saturated or unsaturated organic group;
R2 is a vinyl-containing unsaturated group.
It is preferable that the vinyl-containing unsaturated group, as mentioned above, is selected from:

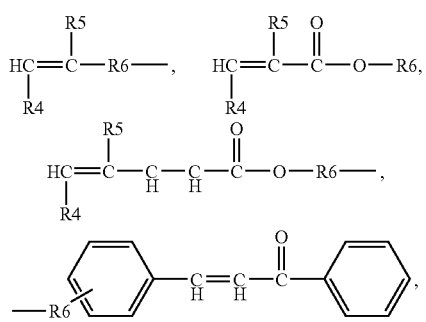

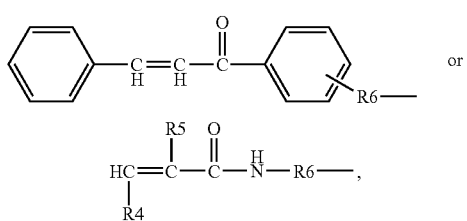 or

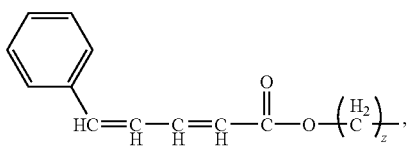

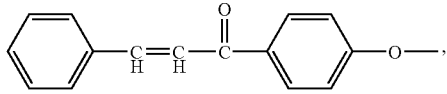

wherein
each of R4 and R5 is independently H or a substituted or unsubstituted C1-C5 alkyl group, and
R6 is a covalent bond or is a substituted or unsubstituted C1-C20 organic group.

It is more preferable that the vinyl-containing unsaturated group, as mentioned above, is independently selected from the group consisting of:

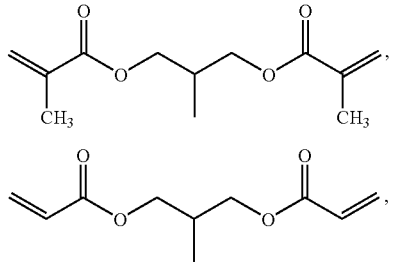

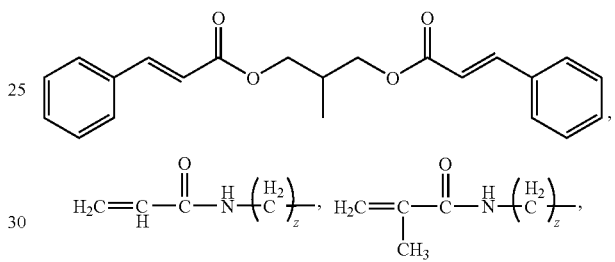

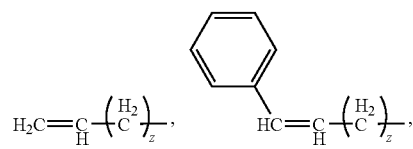

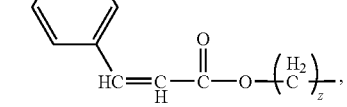

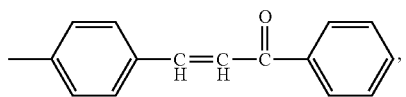

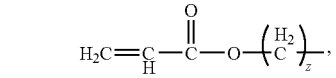

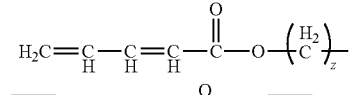

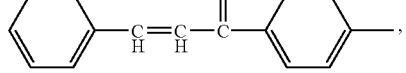

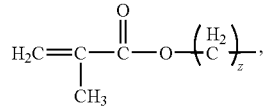

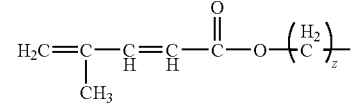

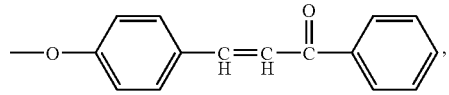

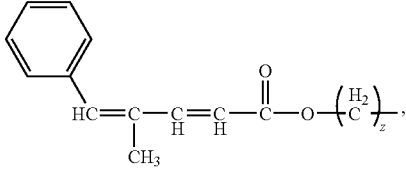

wherein z is an integer of 0-6.

It is especially preferable that the vinyl-containing unsaturated group, as mentioned above, is independently selected from the group consisting of:

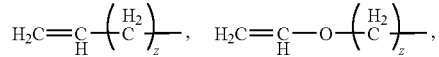

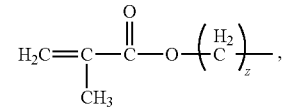

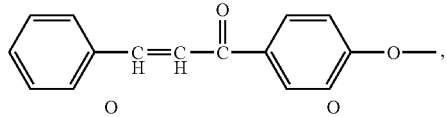

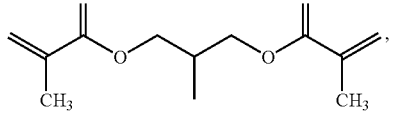

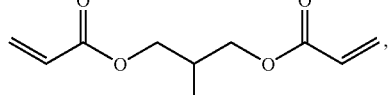

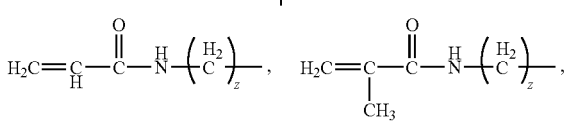

wherein z is an integer of 0-6.

Preferably, R1 is a group selected from the following groups:

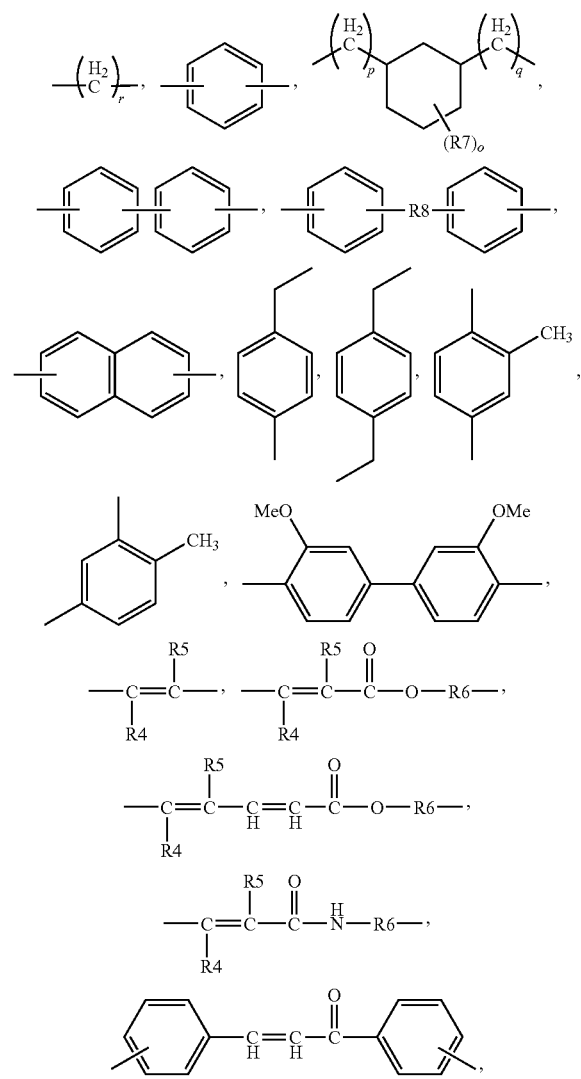

wherein
- o, p, q and r are each independently an integer of 0 or greater than 0;
- R4, R5 and R6 have the same meaning as defined above;
- R7 is H or substituted or unsubstituted C1-C12 organic group; and
- R8 is a covalent bond or an organic group selected from:

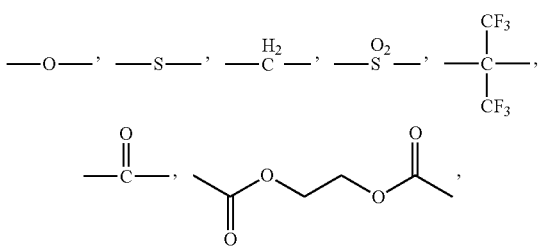

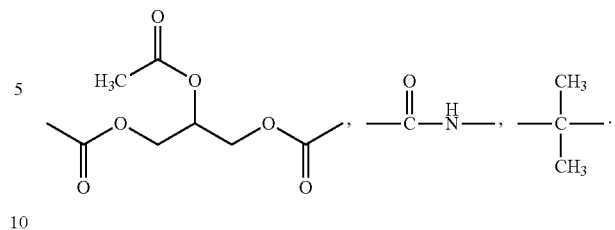

More preferably, R1 is a group selected from the following groups:

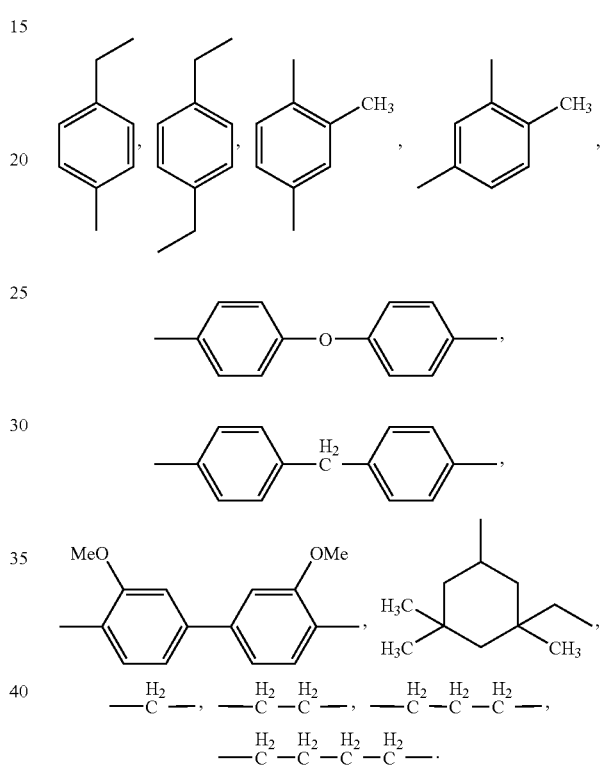

There is no particular restriction on the divalent organic group B and D contained in the photosensitive polyimide of formula (I) of the invention, which for example, may be a divalent aromatic group, a divalent aliphatic group or a divalent group containing a siloxy group. Preferably, B and D are each independently selected from the group consisting of:

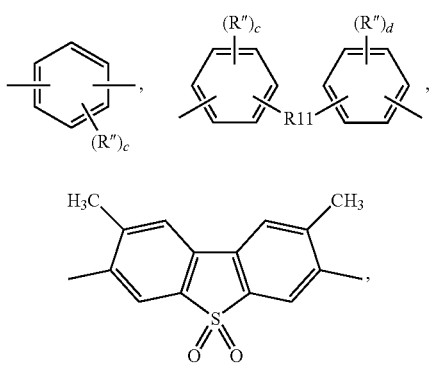

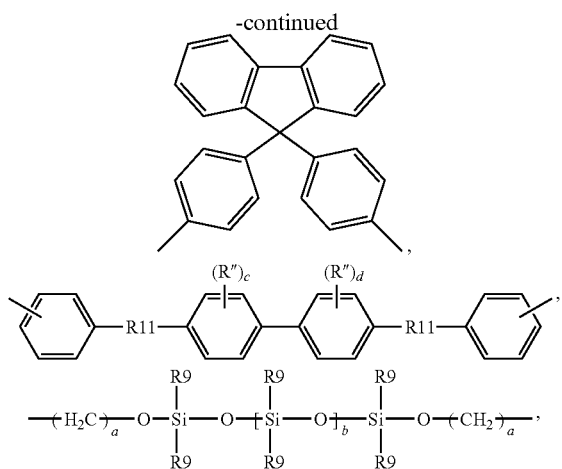

wherein
- R" is —H, C1-C4 alkyl, C1-C4 perfluoroalkyl, methoxy, ethoxy, halogen, OH, COOH, $NH_2$ or SH;
- R9 is H, methyl or ethyl;
- c is an integer of 0-4;
- d is an integer of 0-4;
- a is an integer of greater than 0;
- b is an integer of greater than 0; and
- each R11 is a covalent bond or a group selected from the following groups:

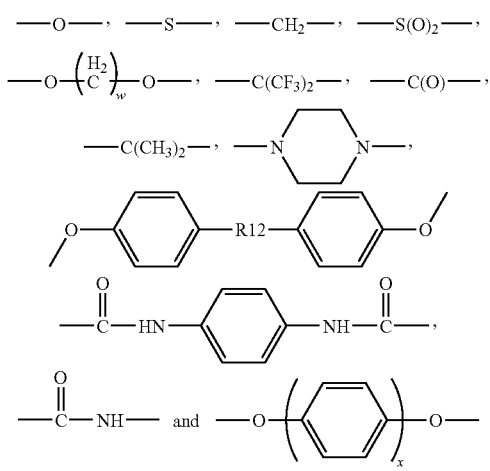

wherein
- w and x are each independently an integer of greater than 0; and
- R12 is $-S(O)_2-$, $-C(O)-$, a covalent bond or a substituted or unsubstituted C1-C18 organic group.

More preferably, B and D in formula (I) are each independently selected from the group consisting of:

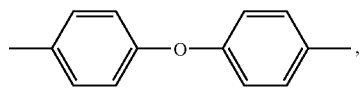

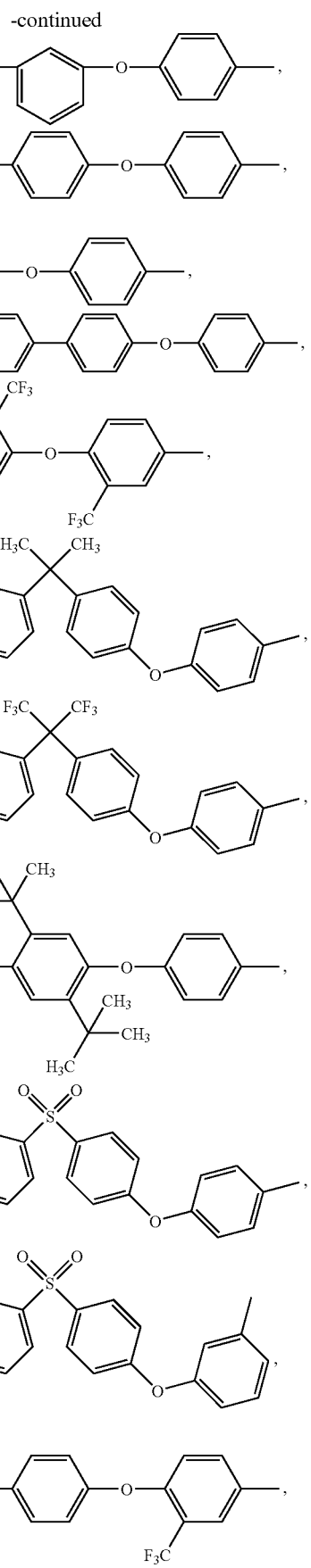

-continued

-continued

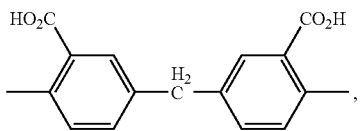

wherein y is an integer of 1-12, preferably an integer of 1-6.

In the photosensitive polyimide of formula (I) of the invention, A is derived from acid anhydride having reactive functional groups including OH, COOH or $NH_2$. It is preferable that each A is independent selected from the group consisting of:

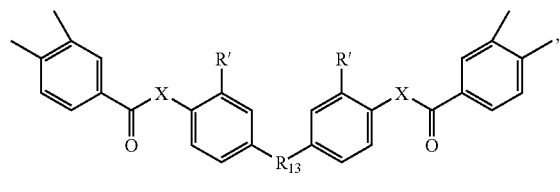

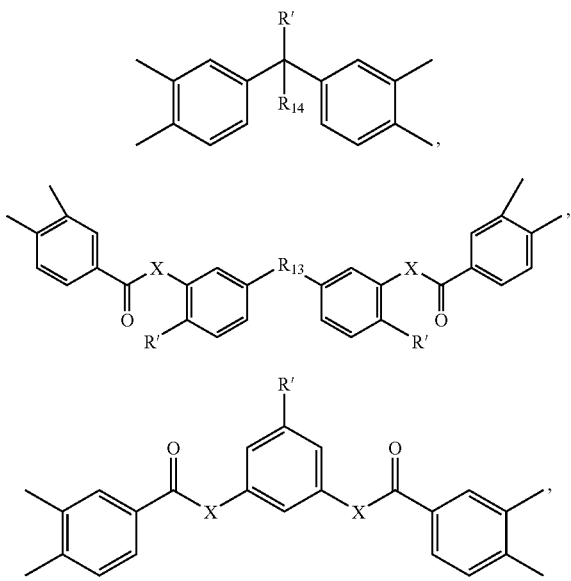

wherein

R' is an organic group selected from:

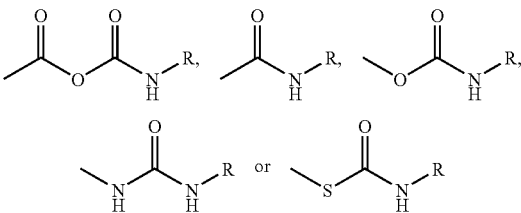

wherein R has the same meaning as defined above;

$R_{13}$ is —$CH_2$—, —O—, —S—, —CO—, —$SO_2$—, —$C(CH_3)_2$— or —$C(CF_3)_2$—;

$R_{14}$ is —H or —$CH_3$—;

X is —O—, —NH— or —S—.

It is more preferable that each A is independent selected from the group consisting of:

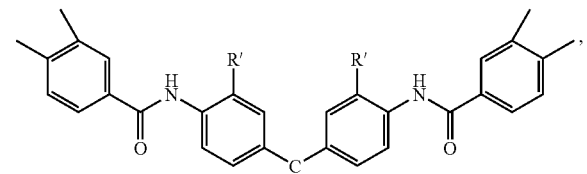

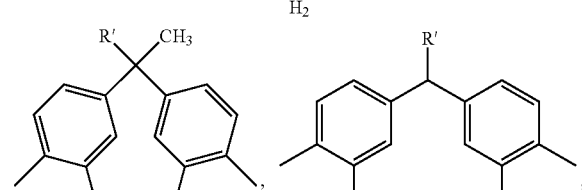

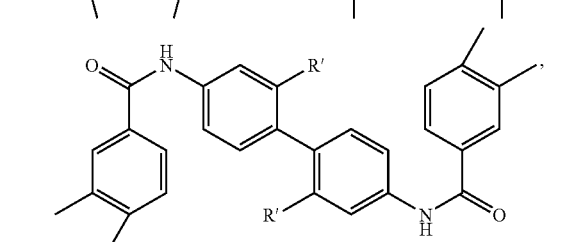

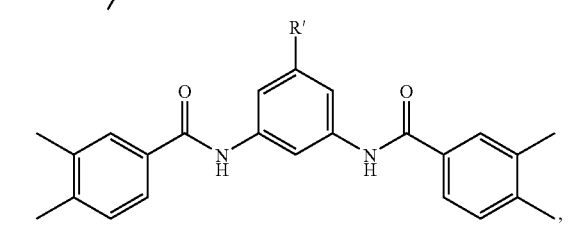

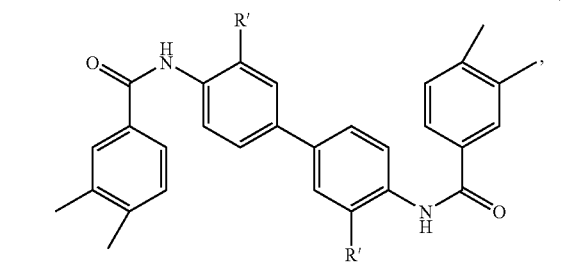

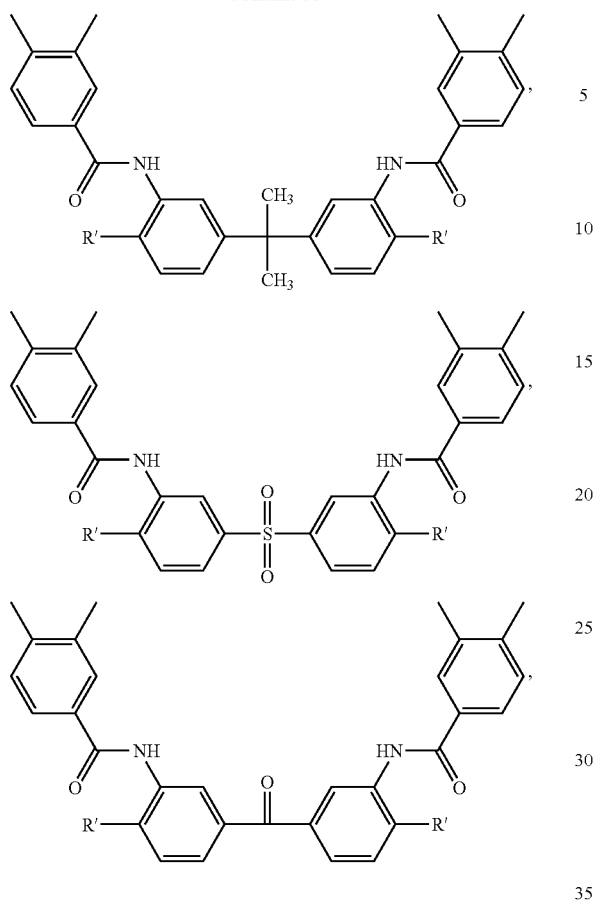
wherein R' has the same meaning as defined above.
In the photosensitive polyimide of formula (I) of the invention, J is a group derived from an acid anhydride monomer, which can be with or without reactive functional groups. It is preferable that J is selected from the group consisting of:
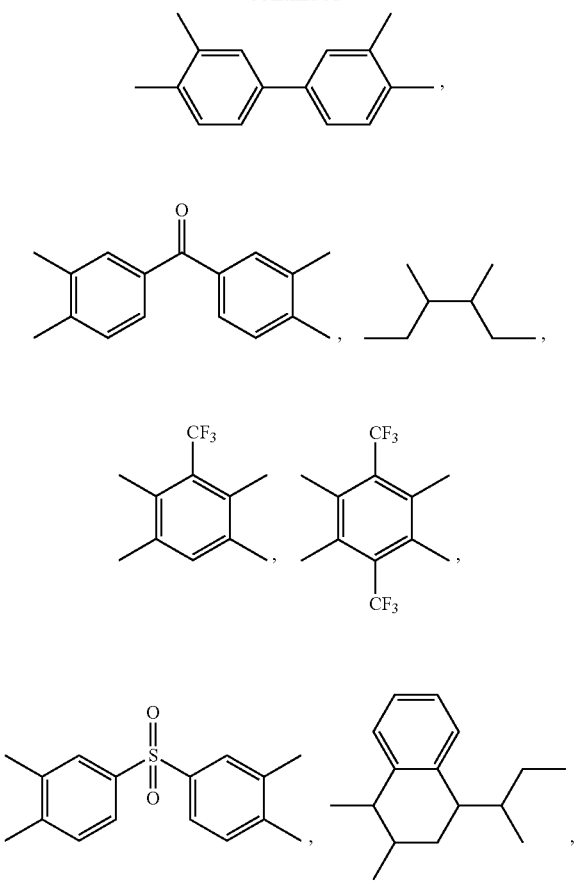
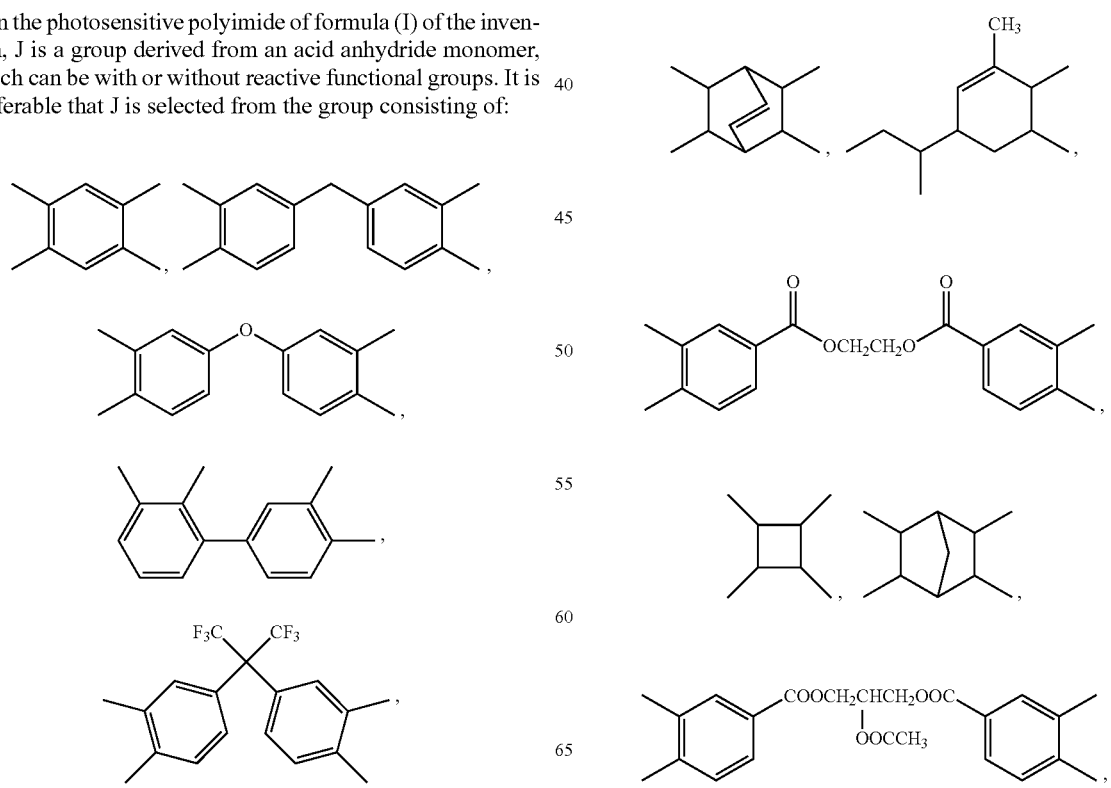

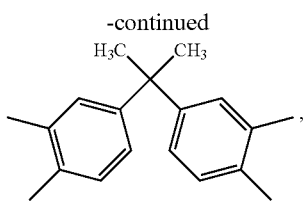
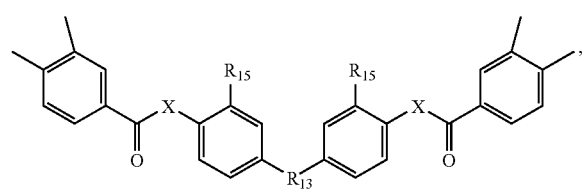
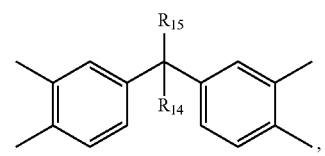
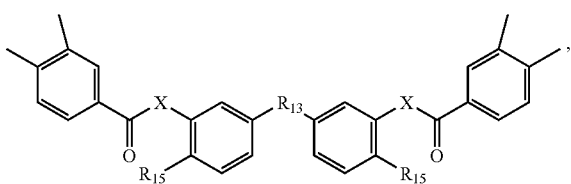
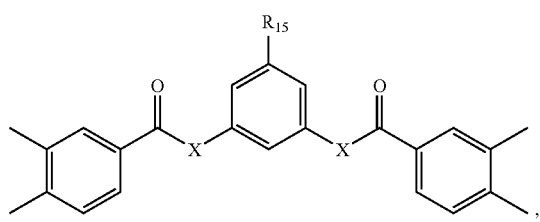
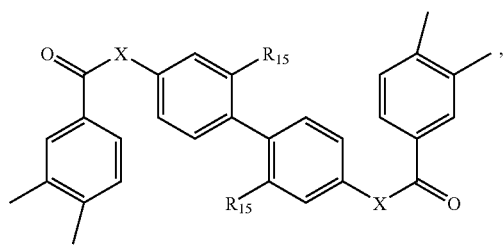
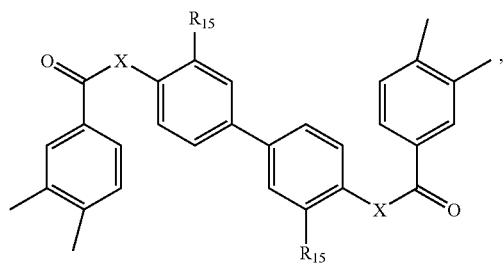
wherein
$R_{15}$ is OH, COOH or $NH_2$;
$R_{13}$ is —$CH_2$—, —O—, —S—, —CO—, —$SO_2$—, —$C(CH_3)_2$— or —$C(CF_3)_2$—;
$R_{14}$ is —H or —$CH_3$—;
X is —O—, —NH— or —S—.
It is more preferably that J in formula (I) is selected from the group consisting of:
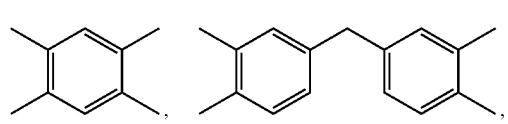
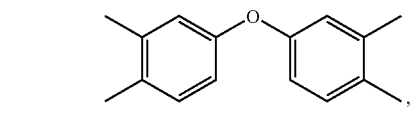
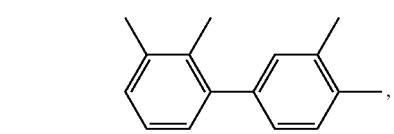
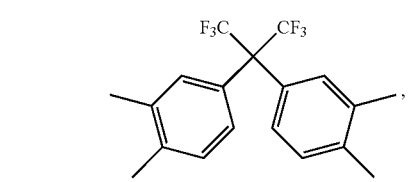
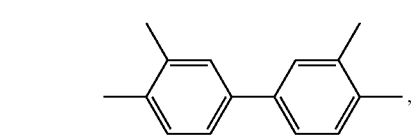
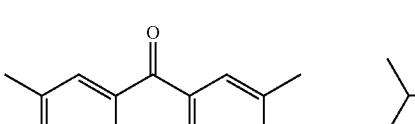
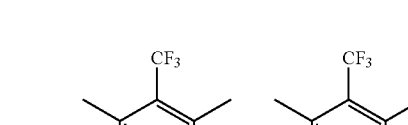

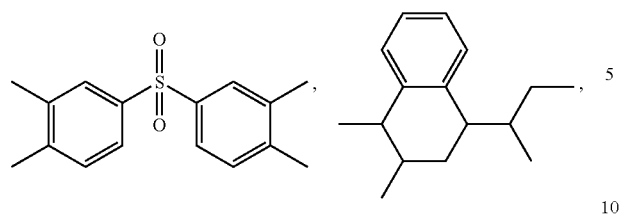
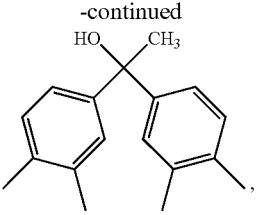
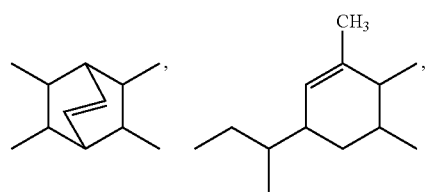
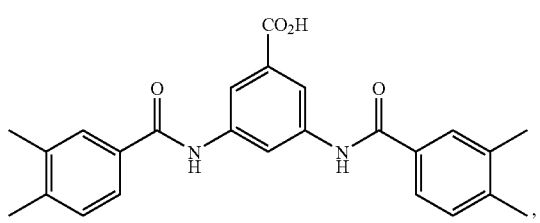
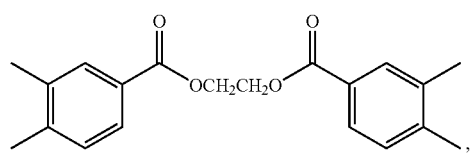
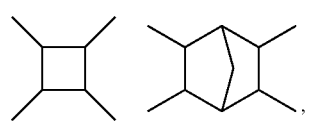
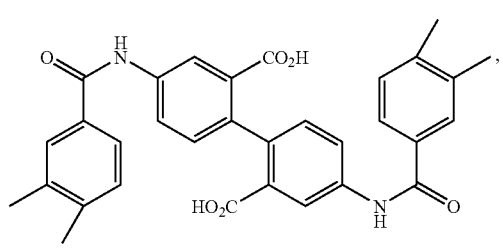
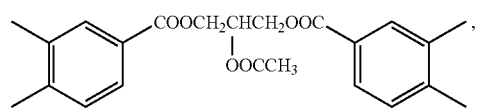
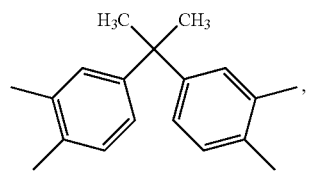
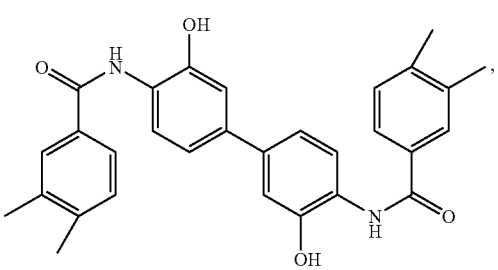
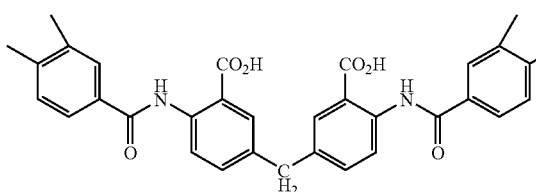
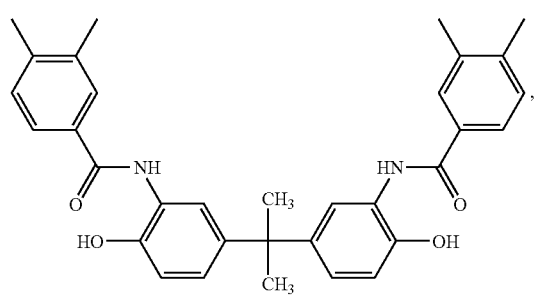
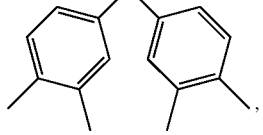
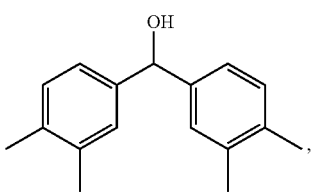
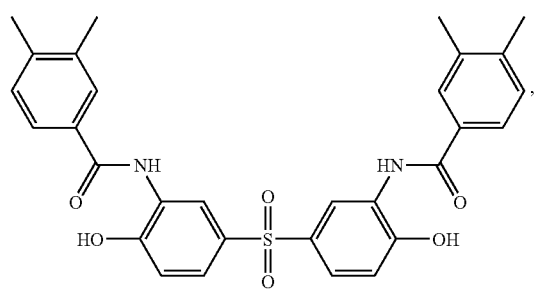

-continued

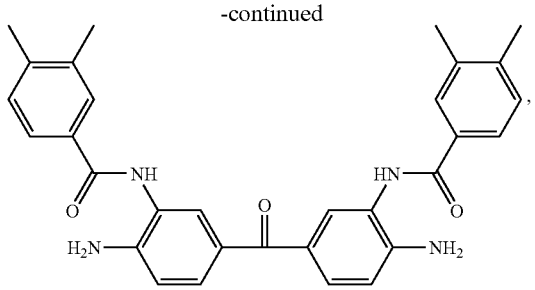

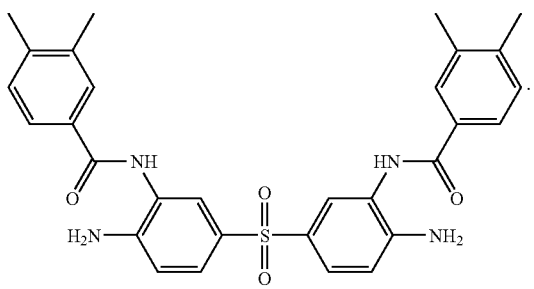

The photosensitive polyimide of the invention can be prepared by the conventional polymerization methods known by people having ordinary knowledge in the same field. For example, the photosensitive polyimide can be prepared by a method comprising:
(a) reacting a diamine monomer having formula $H_2N$—P—$NH_2$ with a dianhydride monomer having formula

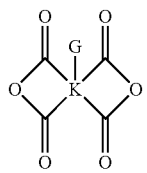

and another dianhydride having formula

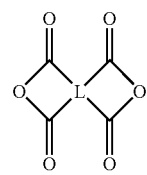

to form a compound having formula (1):

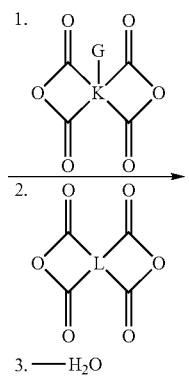

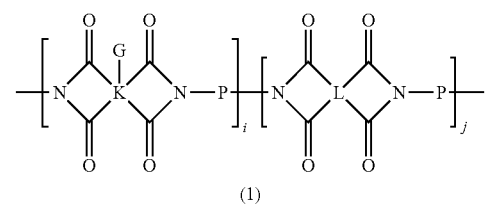

wherein G is a reactive functional group such as OH, COOH or $NH_2$.

Taking COOH as an example, the next reaction step comprises:
(b) adding the product of step (a) to an isocyanate compound having formula O=C=N—R to form a compound of formula (2),

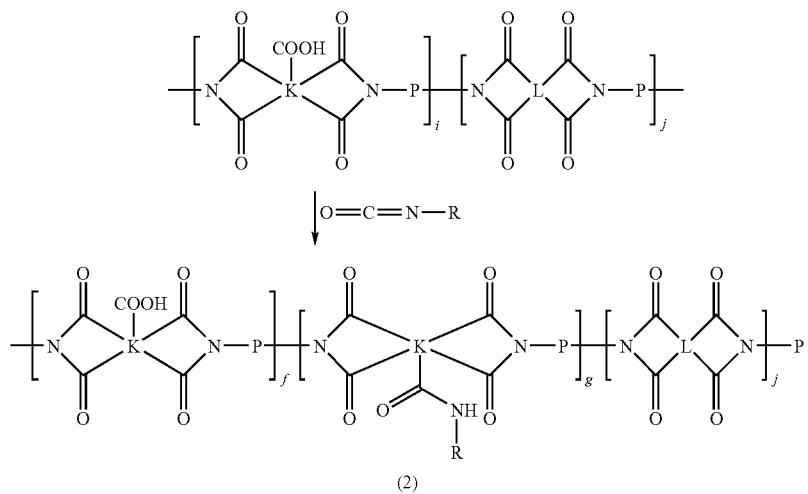

wherein f+g=i.

The method for preparing photosensitive polyimide, as mentioned above, can utilize the acid anhydride monomer having reactive functional groups of the invention, which is selected from the group consisting of:

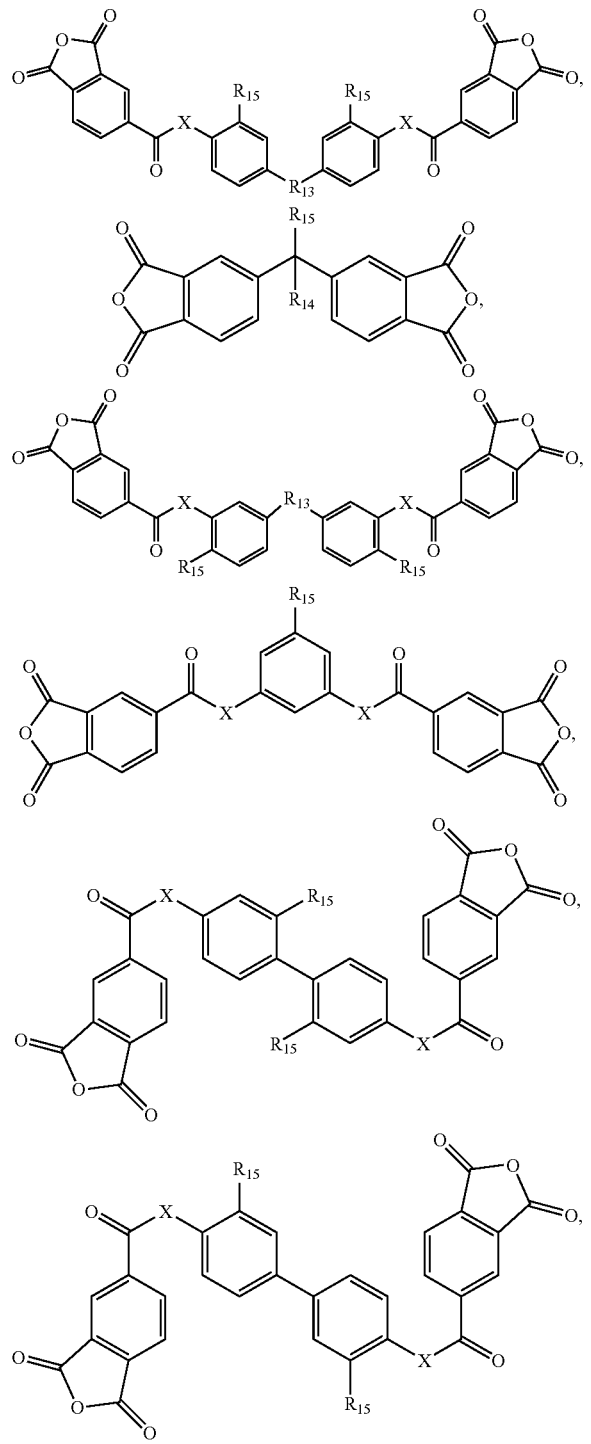

wherein
$R_{15}$ is OH, COOH or $NH_2$;
$R_{13}$ is —$CH_2$—, —O—, —S—, —CO—, —$SO_2$—, —$C(CH_3)_2$— or —$C(CF_3)_2$—;
$R_{14}$ is —H or —$CH_3$—;
X is —O—, —NH— or —S—.

Preferably, the acid anhydride having reactive functional groups, used in the invention, can be selected from the group consisting of:

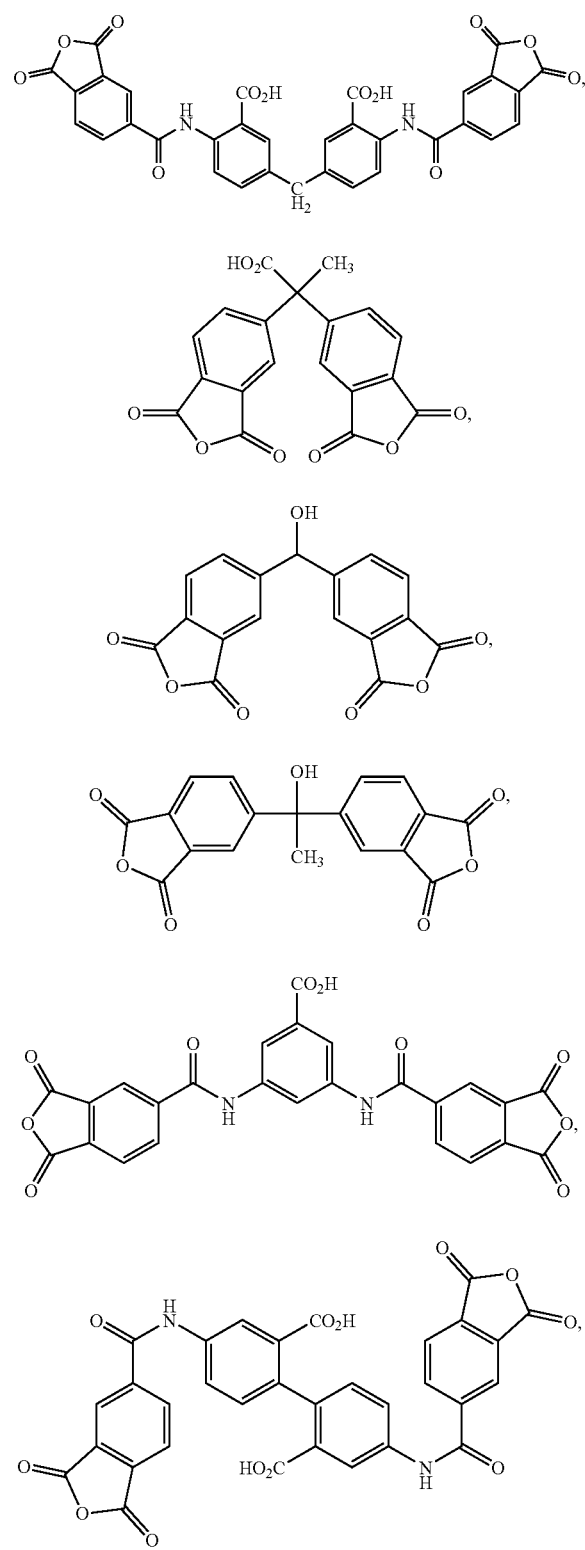

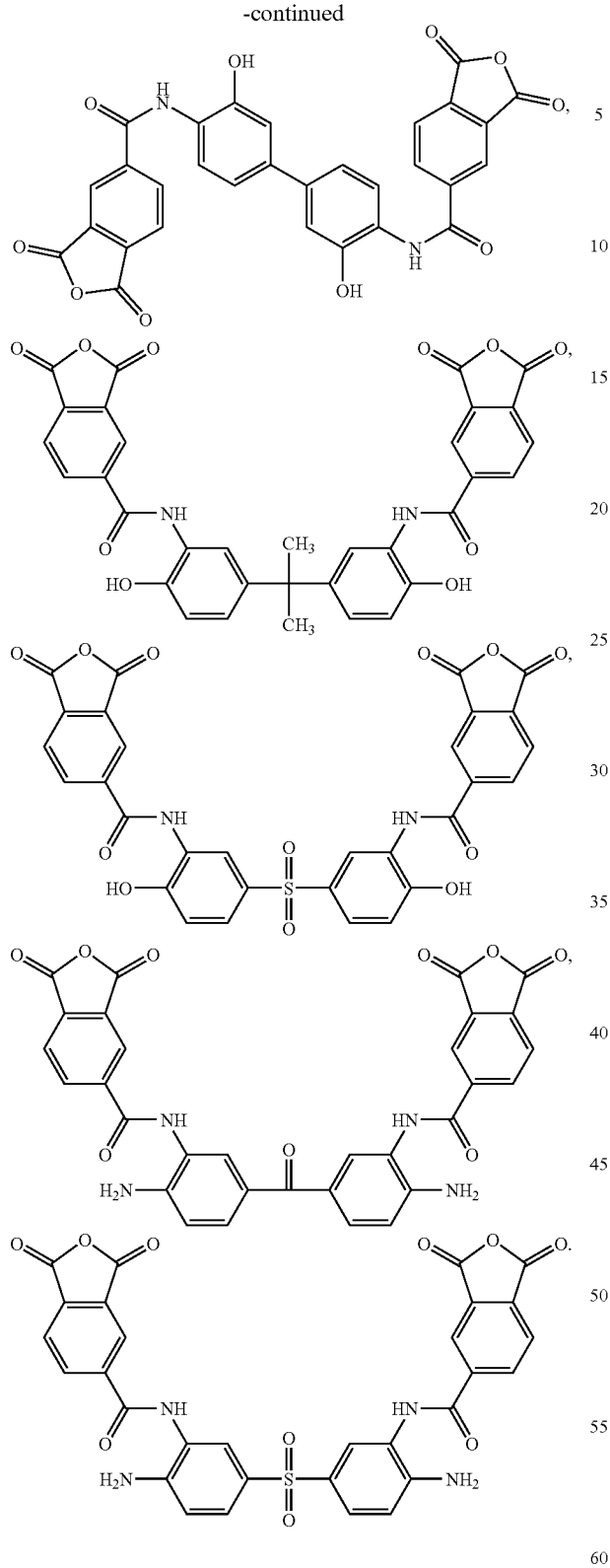

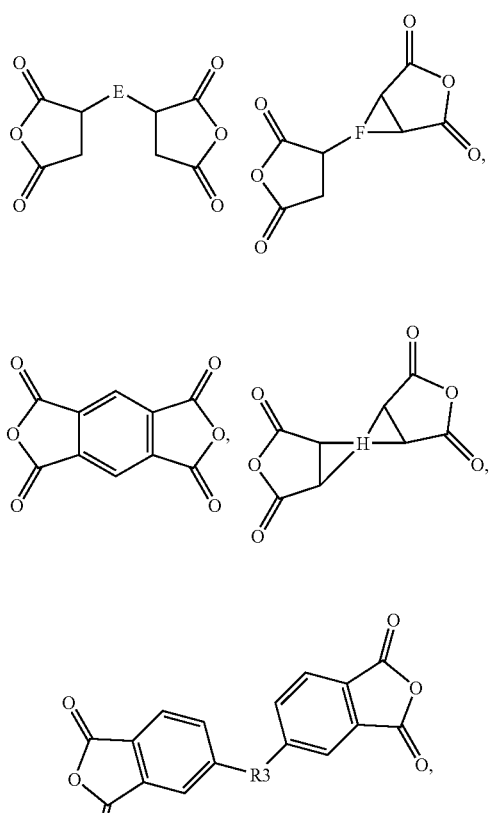

wherein
E, F and H are each independently a covalent bond or a substituted or unsubstituted C1-C20 saturated or unsaturated, cyclic or non-cyclic organic group; R3 is a covalent bond or is selected from the following groups:

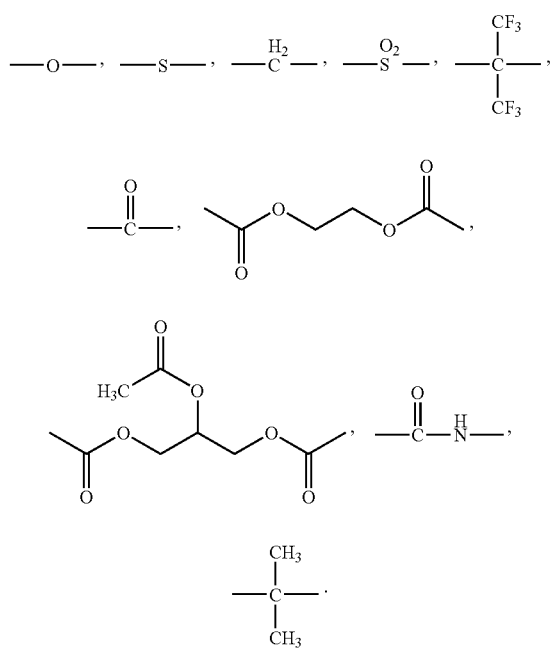

Though there is no particular restriction, another acid anhydride used in the method for preparing the photosensitive polyimide, as mentioned above, can be with or without reaction functional groups. The acid anhydride without bearing reaction functional groups, used in the invention, are known by people skilled in the same field, and can be, for example, but not limited to:

Preferably, the another acid anhydride monomer used in the invention can be selected from the group consisting of:

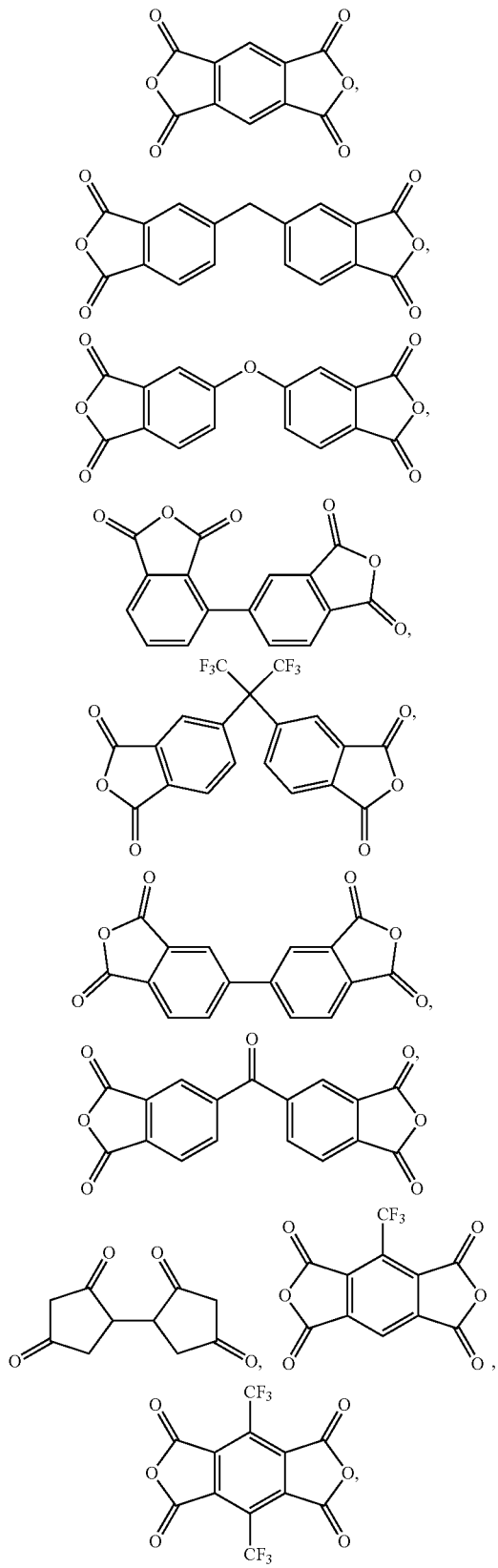

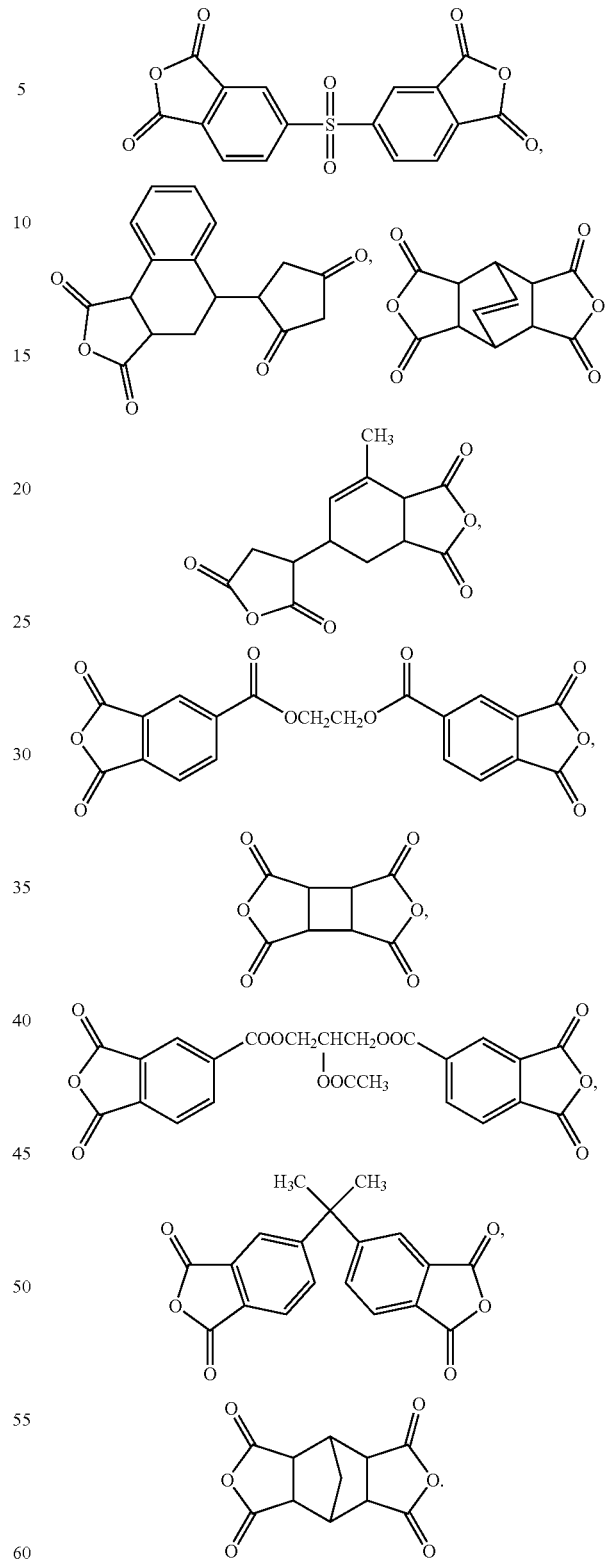

The diamine monomer used in the method for preparing the photosensitive polyimide, as mentioned above, generally can be aliphatic, aromatic or siloxy-containing divalent groups. Preferably, the diamine monomer comprises, but is not limited to, the following structures:

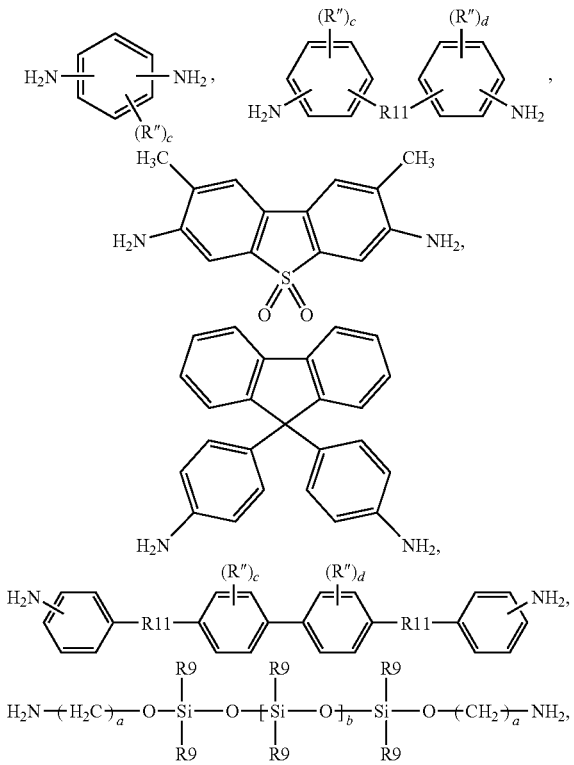

wherein
R″ is —H, C1-C4 alkyl, C1-C4 perfluoroalkyl, methoxy, ethoxy, halogen, OH, COOH, NH₂ or SH;
R9 is H, methyl or ethyl;
c is an integer of 0-4;
d is an integer of 0-4;
a is an integer of greater than 0;
b is an integer of greater than 0; and
R11 are each independently a covalent bond or a group selected from the following groups:

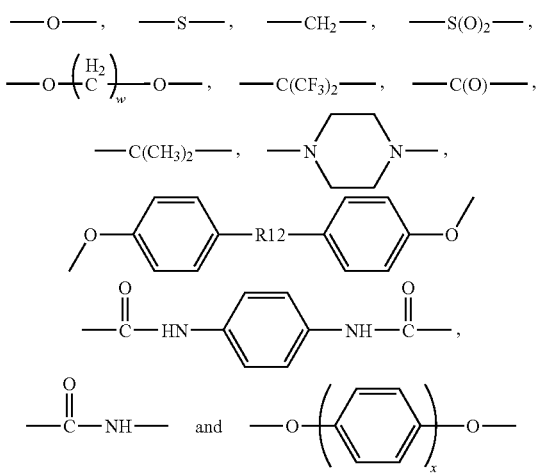

wherein
w and x are each independently an integer of greater than 0; and
R12 is —S(O)₂—, —C(O)—, a covalent bond or a substituted or unsubstituted C1-C18 organic group.

Preferably, the diamine monomer can be selected from the group consisting of the following compounds:

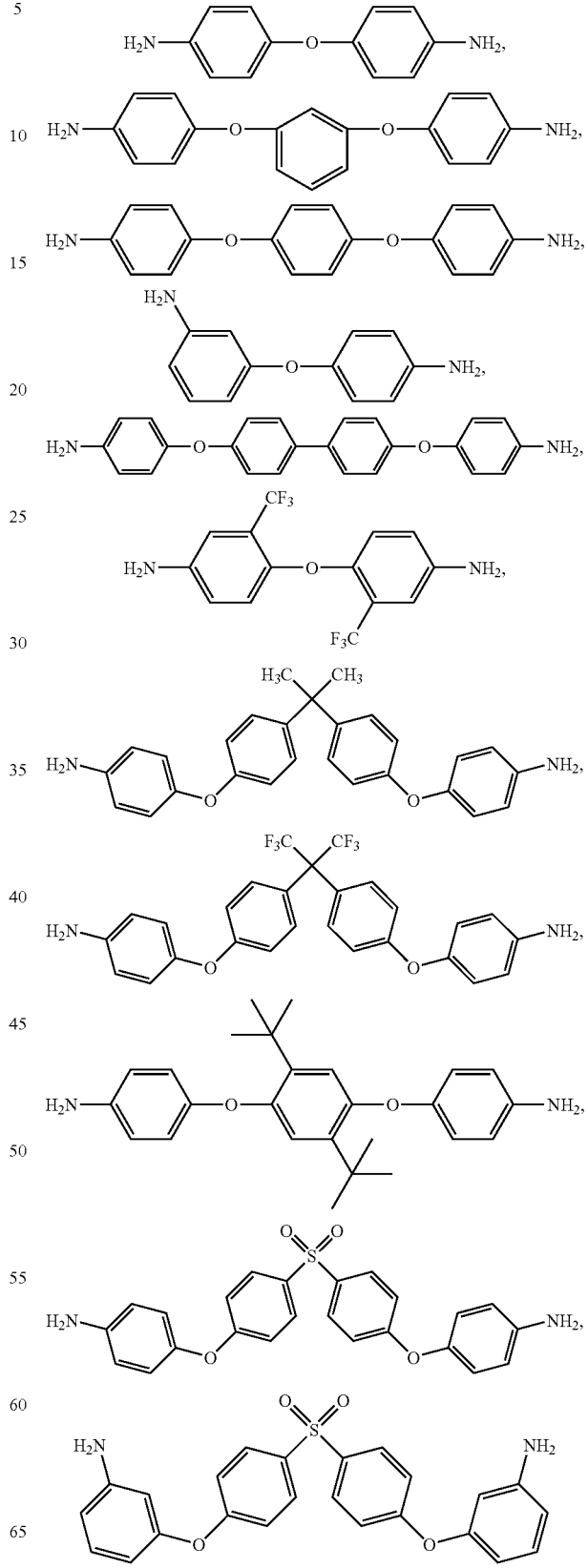

-continued
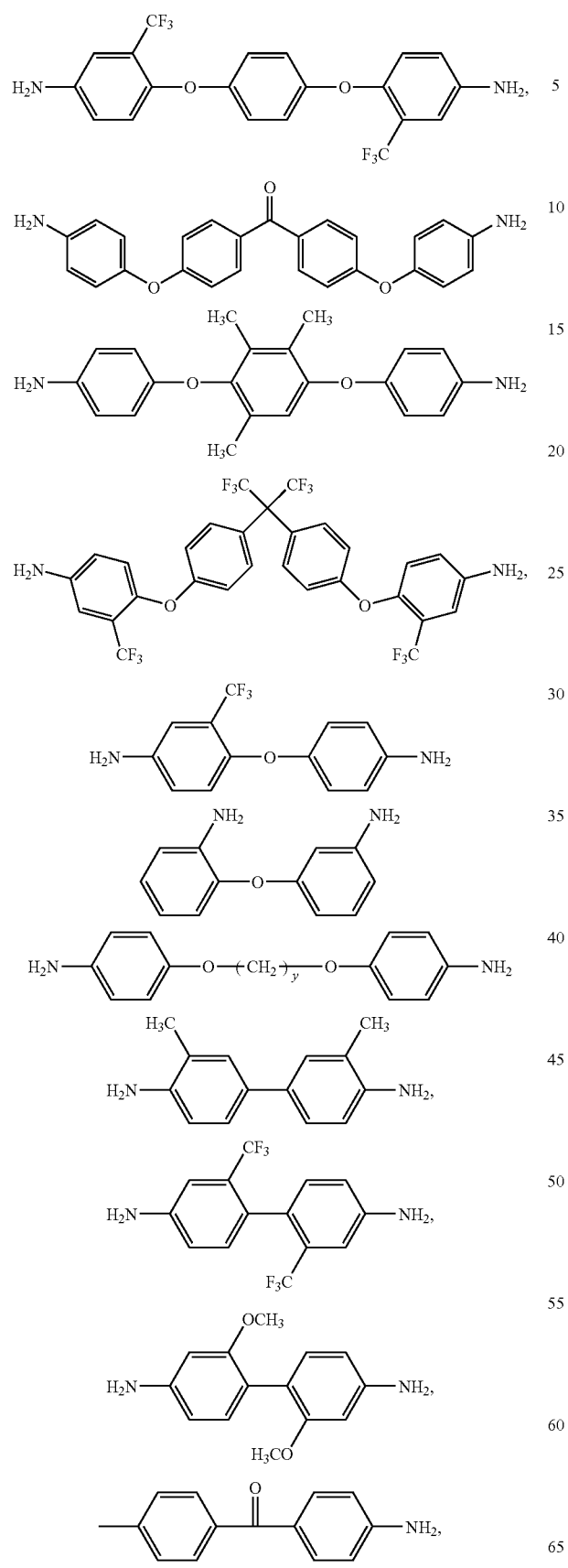
-continued
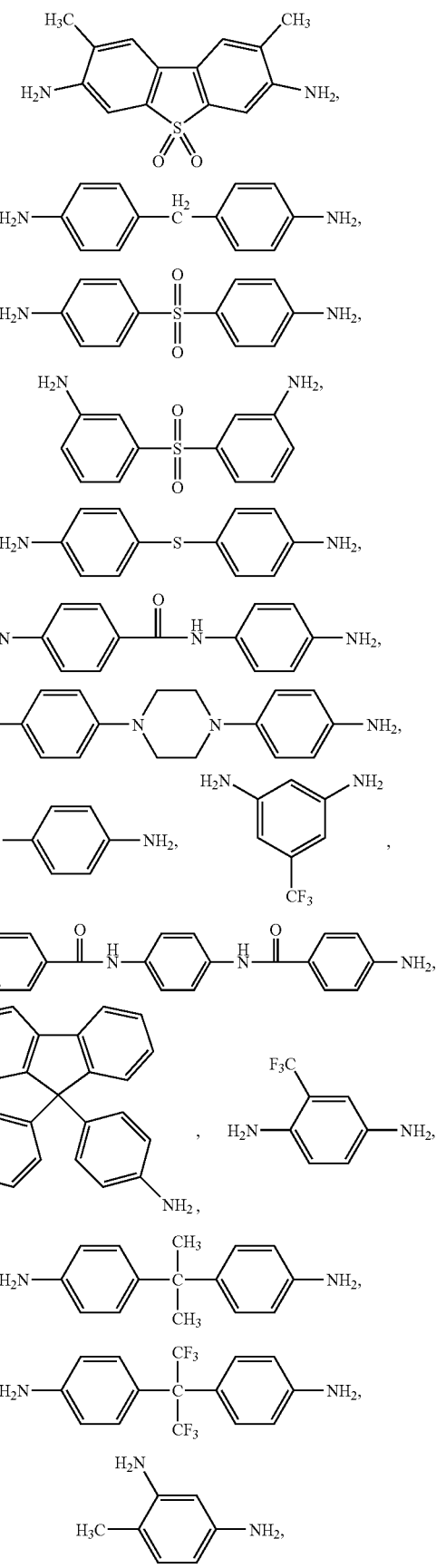

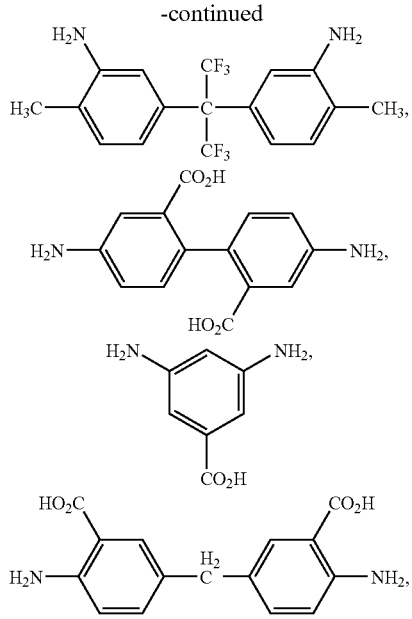

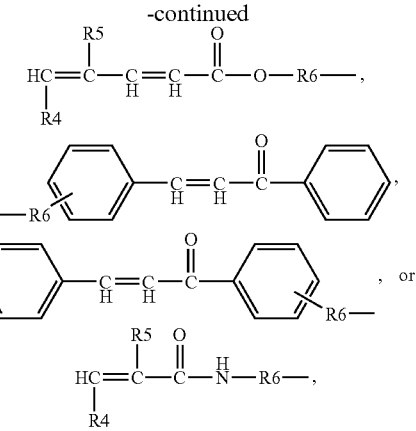

wherein y is an integer of 1-12, preferably an integer of 1-6.

In order to impart polyimides with a photosensitive group so that radiation curing mechanism can be utilized, the present invention modifies polyimides with an isocyanate having a photosensitive group, such as C=C group. The isocyanates can be mono-isocyanates or di-isocyanates, preferably mono-isocyanates. The isocyanates used in the invention can react with reactive groups, such as hydroxyl (—OH), carboxy (—COOH), amino (—NH$_2$), etc, in the polyimides and thus makes the polyimides modified. The isocyanate used in the invention has the structure O=C=N—R, wherein R is R* or a group having the following structures:

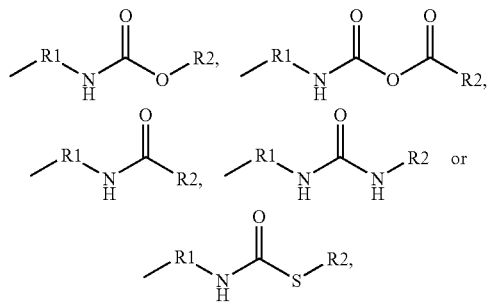

wherein
R* and R2 are each independently a photosensitive group of vinyl-containing unsaturated group; and
R1 is a substituted or unsubstituted C1-C20 saturated or unsaturated organic group.

According to an embodiment of the invention, the vinyl-containing unsaturated group is selected from the following groups:

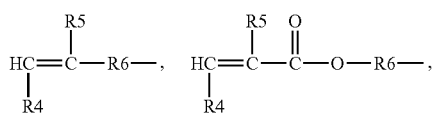

wherein
R4 and R5 are each independently H or a substituted or unsubstituted C1-C5 alkyl group, and
R6 is a covalent bond or substituted or unsubstituted C1-C20 organic group;
R1 is a group selected from the following groups:

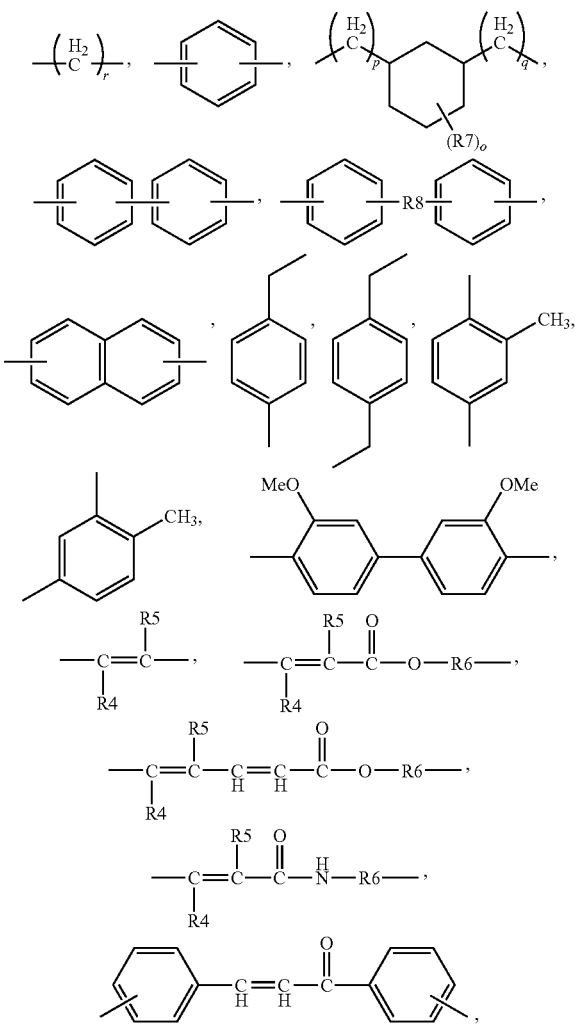

wherein
o, p, q and r are each independently an integer of 0 or greater than 0;
R4, R5 and R6 have the same meaning as defined above;
R7 is H or a substituted or unsubstituted C1-C12organic group; and
R8 is a covalent bond or an organic group selected from:

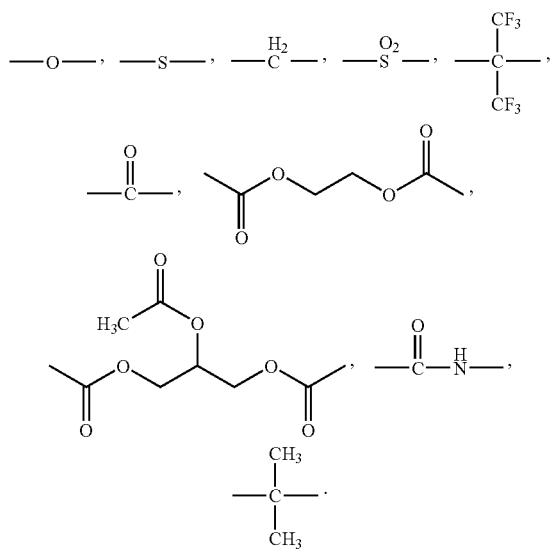

The invention further provides a photosensitive composition, which comprises at least 1% by weight of the photosensitive polyimide of formula (I), a photoinitiator and a solvent. The photosensitive composition of the invention can be used in a liquid photo resist composition or dry film photo resist composition, or used in a solder resist, coverlay film or printed wiring board. The weight percentage of the components in the photosensitive composition can be modified depending on the product demand. Generally, the amount of the photosensitive polyimide, based on the total weight of the composition, is at least 1% by weight, preferably between 10 and 50% by weight. The amount of the photoinitiator based on the total weight of the composition is at least 0.001% by weight, preferably between 0.01 to 1% by weight.

There is no particular restriction on the photoinitiator used for the photosensitive composition. Examples of the photoinitiator are selected from the group consisting of: benzophenone, benzoin, 2-hydroxy-2-methyl-1-phenyl-propan-1-one, 2,2-dimethoxy-1,2-diphenylethan-1-one, 1-hydroxy cyclohexyl phenyl ketone, 2,4,6-trimethylbenzoyl diphenyl phosphine oxide, N-phenylglycine, 9-phenylacridine, benzyldimethylketal, 4,4'-bis(diethylamino)benzophenone, 2,4,5-triarylimidazole dimmers and mixtures thereof. Preferably, the photoinitiator is 2,4,6-trimethylbenzoyl diphenyl phosphine.

According to the invention, there is no particular restriction on the solvent used for the photosensitive composition. For example, the solvent may be selected from the group consisting of, but not limited to: N-methylpyrrolidone (NMP), dimethyl acetamide (DMAC), dimethyl formamide (DMF), dimethyl sulfoxide (DMSO), toluene, xylene and mixtures thereof.

In order to increase the degree of photo-crosslinking, the photosensitive composition of the present invention optionally comprises a certain amount of a reactive monomer or short-chain oligomer for making the molecules crosslinked.

According to the invention, there is no particular restriction on the reactive monomer or short-chain oligomer used for the photosensitive composition. For example, the reactive monomers or short-chain oligomers may be selected from the group consisting of: 1,6-hexanediol diacrylate, neopentyl glycol diacrylate, ethylene glycol diacrylate, pentaerythritol diacrylate, trimethylolpropane triacrylate, pentaerythritol triacrylate, dipentaerythritol hexaacrylate, tetramethylolpropane tetraacrylate, tetraethylene glycol diacrylate, 1,6-hexanediol dimethacrylate, neopentyl glycol dimethacrylate, ethylene glycol dimethacrylate, pentaerythritol dimethacrylate, trimethylolpropane trimethacrylate, pentaerythritol trimethacrylate, dipentaerythritol hexamethacrylate, tetramethylolpropane tetramethacrylate, tetraethylene glycol dimethacrylate, methoxydiethylene glycol methacrylate, methoxypolyethylene glycol methacrylate, β-methacryloyloxyethylhydrodiene phthalate, β-methacryloyloxyethylhydrodiene succinate, 3-chloro-2-hydroxypropyl methacrylate, stearyl methacrylate, phenoxyethyl acrylate, phenoxydiethylene glycol acrylate, phenoxypolyethylene glycol acrylate, β-acryloyloxyethylhydrodiene succinate, lauryl acrylate, ethylene glycol dimethacrylate, diethylene glycol dimethacrylate, triethylene glycol dimethacrylate, polyethylene glycol dimethacrylate, 1,3-butylene glycol dimethacrylate, polypropylene glycol dimethacrylate, 2-hydroxy-1,3-dimethacryloxypropane, 2,2-bis[4-(methacryloxyethoxy)phenyl]propane, 2,2-bis[4-(methacryloxydiethoxy)phenyl]propane, 2,2-bis[4-(methacryloxypolyethoxy)phenyl]propane, polyethylene glycol diacrylate, tripropylene glycol diacrylate, polypropylene glycol diacrylate, 2,2-bis[4-(acryloxydiethoxy)phenyl]propane, 2,2-bis[4-(acryloxypolyethoxy) phenyl]propane, 2-hydroxy-1-acryloxy-3-methacryloxypropane, trimethylolpropane trimethacrylate, tetramethylolmethane triacrylate, tetramethylolmethane tetraacrylate, methoxydipropylene glycol methacrylate, methoxytriethylene glycol acrylate, nonylphenoxypolyethylene glycol acrylate, nonylphenoxypolypropylene glycol acrylate, 1-acryloyloxypropyl-2-phthalate, isostearyl acrylate, polyoxyethylene alkyl ether acrylate, nonylphenoxyethylene glycol acrylate, polypropylene glycol dimethacrylate, 1,4-butanediol dimethacrylate, 3-methyl-1, 5-pentanediol dimethacrylate, 1,6-hexanediol methacrylate, 1,9-nonanediol methacrylate, 2,4-diethyl-1,5-pentanediol dimethacrylate, 1,4-cyclohexanedimethanol dimethacrylate, dipropylene glycol diacrylate, tricyclodecanedimethanol diacrylate, 2,2-hydrogenated bis[4-acryloxypolyethoxy]phenyl)propane, 2,2-bis[4-acryloxypolypropoxy]phenyl)propane, 2,4-diethyl-1,5-pentanediol diacrylate, ethoxylated trimethylolpropane triacrylate, propoxylated trimethylolpropane triacrylate, isocyanuric acid tri(ethaneacrylate), pentaerythritol tetraacrylate, ethoxylated pentaerythritol tetraacrylate, propoxylated pentaerythritol tetraacrylate, ditrimethylolpropane tetraacrylate, dipentaerythritol polyacrylate, triallyl isocyanurate, glycidyl methacrylate, allyl glycidyl ether, 1,3,5-triacryloylhexahydro-s-triazine, triallyl 1,3,5-benzenecarboxylate, triallylamine, triallyl citrate, triallyl phosphate, allobarbital, diallylamine, diallyldimethylsilane, diallyl disulfide, diallyl ether, diallyl cyanurate, diallyl isophthalate, diallyl terephthalate, 1,3-diallyloxy-2-propanol, diallyl sulfide, diallyl maleate, 4,4'-isopropylidenediphenol dimethacrylate, 4,4'-isopropylidenediphenol diacrylate and mixtures thereof. When the reactive monomer or oligomer are present in the photosensitive composition of the invention, the amount of the reactive monomer or oligomer, based on the total weight of the composition, is at least 0.1% by weight, preferably 0.1-30% by weight.

The invention is further described with reference to the following Examples, to which the invention is not limited. Various modifications and variations made by any one familiar with the technical field of the invention without violating the spirit of the invention, are within the scope of the invention.

EXAMPLES

The abbreviations used in the following Examples are defined below:

DA1:

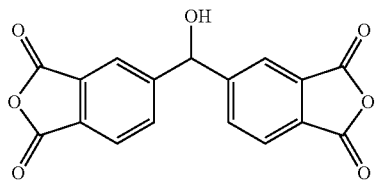

DA2:

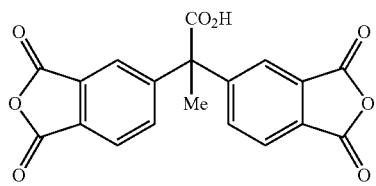

DA3:

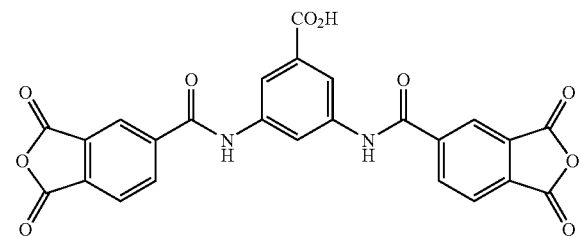

DA4:

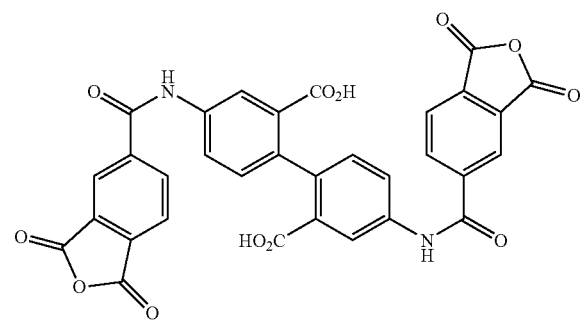

DA5:

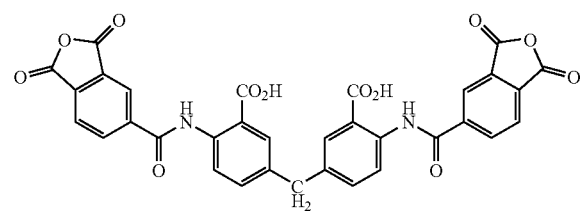

DA6:

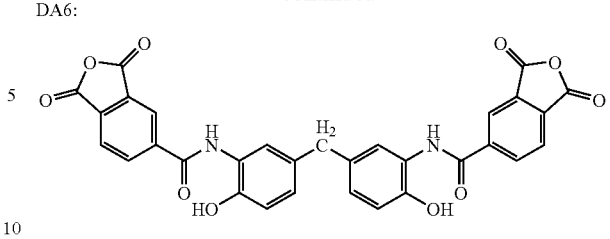

6FDA: 4,4'-hexafluoroisopropylidene-2,2-bis-(phthalic acid anhydride)
DMDB: 2,2'-dimethylbiphenyl-4,4'-diamine
ODA: 4,4'-oxydibenzenamine
2-IEA: 2-isocyanatoethyl acrylate
1-MI: 1-methylimidazole
PTZ: phenothiazine
DMAC: dimethyl acetamide
NMP: N-methylpyrrolidone Example 1

Synthesis of isocyanate-modified polyimide (P1)

To weighed 64.85 g (0.2 mol) of DA1 and 42.46 g (0.2 mol) of DMDB, 300 mL of NMP was added. The mixture was stirred at room temperature for 1 hour, and then successively heated to 50° C. and stirred for 4 hours. After 4 hours, 50 mL of toluene was added. The resulting solution was dehydrated with the Dean-Stark apparatus at 130° C. After the dehydration was complete, the solution was cooled to room temperature followed by the addition of 7 g (0.05 mol) of 2-IEA, 0.05 g of 1-MI and 0.06 g of PTZ. After the addition was complete, the solution was heated to 80° C. and stirred for 8 hours. Then, P1 was obtained.

Example 2

Synthesis of isocyanate-modified polyimide (P2)

To weighed 73.256 g (0.2 mol) of DA2 and 42.46 g (0.2 mol) of DMDB, 350 mL of NMP was added. The mixture was stirred at room temperature for 1 hour, and then successively heated to 50° C. and stirred for 4 hours. After 4 hours, 50 mL of toluene was added. The resulting solution was dehydrated with the Dean-Stark apparatus at 130° C. After the dehydration was complete, the solution was cooled to room temperature followed by the addition of 7 g (0.05 mol) of 2-IEA, 0.05 g of 1-MI and 0.06 g of PTZ. After the addition was complete, the solution was heated to 80° C. and stirred for 8 hours. Then, P2 was obtained.

Example 3

Synthesis of isocyanate-modified polyimide (P3)

To weighed 100.074 g (0.2 mol) of DA3 and 42.46 g (0.2 mol) of DMDB, 450 mL of NMP was added. The mixture was stirred at room temperature for 1 hour, and then successively heated to 50° C. and stirred for 4 hours. After 4 hours, 50 mL of toluene was added. The resulting solution was dehydrated with the Dean-Stark apparatus at 130° C. After the dehydration was complete, the solution was cooled to room temperature followed by the addition of 7 g (0.05 mol) of 2-IEA, 0.05 g of 1-MI and 0.06 g of PTZ. After the addition was complete, the solution was heated to 80° C. and stirred for 8 hours. Then, P3 was obtained.

Example 4

Synthesis of isocyanate-modified polyimide (P4)

To weighed 124.1 g (0.2 mol) of DA4 and 42.46 g (0.2 mol) of DMDB, 550 mL of NMP was added. The mixture was stirred at room temperature for 1 hour, and then successively heated to 50° C. and stirred for 4 hours. After 4 hours, 50 mL of toluene was added. The resulting solution was dehydrated with the Dean-Stark apparatus at 130° C. After the dehydration was complete, the solution was cooled to room temperature followed by the addition of 14 g (0.1 mol) of 2-IEA, 0.1 g of 1-MI and 0.12 g of PTZ. After the addition was complete, the solution was heated to 80° C. and stirred for 8 hours. Then, P4 was obtained.

Example 5

Synthesis of isocyanate-modified polyimide (P5)

To weighed 126.9 g (0.2 mol) of DA5 and 42.46 g (0.2 mol) of DMDB, 550 mL of NMP was added. The mixture was stirred at room temperature for 1 hour, and then successively heated to 50° C. and stirred for 4 hours. After 4 hours, 50 mL of toluene was added. The resulting solution was dehydrated with the Dean-Stark apparatus at 130° C. After the dehydration was complete, the solution was cooled to room temperature followed by the addition of 14 g (0.1 mol) of 2-IEA, 0.1 g of 1-MI and 0.12 g of PTZ. After the addition, the solution was heated to 80° C. and stirred for 8 hours. Then, P5 was obtained.

Example 6

Synthesis of isocyanate-modified polyimide (P6)

To weighed 115.7 g (0.2 mol) of DA6 and 42.46 g (0.2 mol) of DMDB, 500 mL of NMP was added. The mixture was stirred at room temperature for 1 hour, and then successively heated to 50° C. and stirred for 4 hours. After 4 hours, 50 mL of toluene was added. The resulting solution was dehydrated with the Dean-Stark apparatus at 130° C. After the dehydration was complete, the solution was cooled to room temperature followed by the addition of 7 g (0.05 mol) of 2-IEA, 0.05 g of 1-MI and 0.06 g of PTZ. After the addition was complete, the solution was heated to 80° C. and stirred for 8 hours. Then, P6 was obtained.

Example 7

Synthesis of isocyanate-modified polyimide (P7)

To weighed 64.85 g (0.2 mol) of DA1 and 40.05 g (0.2 mol) of ODA, 300 mL of DMAC was added. The mixture was stirred at room temperature for 1 hour, and then successively heated to 50° C. and stirred for 4 hours. After 4 hours, 50 mL of toluene was added. The resulting solution was dehydrated with the Dean-Stark apparatus at 130° C. After the dehydration was complete, the solution was cooled to room temperature followed by the addition of 7 g (0.05 mol) of 2-IEA, 0.05 g of 1-MI and 0.06 g of PTZ. After the addition, the solution was heated to 80° C. and stirred for 8 hours. Then, P7 was obtained.

Example 8

Synthesis of isocyanate-modified polyimide (P8)

To weighed 73.26 g (0.2 mol) of DA2 and 40.05 g (0.2 mol) of ODA, 350 mL of DMAC was added. The mixture was stirred at room temperature for 1 hour, and then successively heated to 50° C. and stirred for 4 hours. After 4 hours, 50 mL of toluene was added. The resulting solution was dehydrated with the Dean-Stark apparatus at 130° C. After the dehydration was complete, the solution was cooled to room temperature followed by the addition of 7 g (0.05 mol) of 2-IEA, 0.05 g of 1-MI and 0.06 g of PTZ. After the addition, the solution was heated to 80° C. and stirred for 8 hours. Then, P8 was obtained.

Example 9

Synthesis of isocyanate-modified polyimide (P9)

To weighed 100.074 g (0.2 mol) of DA3 and 40.05 g (0.2 mol) of ODA, 450 mL of DMAC was added. The mixture was stirred at room temperature for 1 hour, and then successively heated to 50° C. and stirred for 4 hours. After 4 hours, 50 mL of toluene was added. The resulting solution was dehydrated with the Dean-Stark apparatus at 130° C. After the dehydration was complete, the solution was cooled to room temperature followed by the addition of 7 g (0.05 mol) of 2-IEA, 0.05 g of 1-MI and 0.06 g of PTZ○ After the addition, the solution was heated to 80° C. and stirred for 8 hours. Then, P9 was obtained.○

Example 10

Synthesis of isocyanate-modified polyimide (P10)

To weighed 124.1 g (0.2 mol) of DA4 and 40.05 g (0.2 mol) of ODA, 550 mL of DMAC was added. The mixture was stirred at room temperature for 1 hour, and then successively heated to 50° C. and stirred for 4 hours. After 4 hours, 50 mL of toluene was added. The resulting solution was dehydrated with the Dean-Stark apparatus at 130° C. After the dehydration was complete, the solution was cooled to room temperature followed by the addition of 14 g (0.1 mol) of 2-IEA, 0.1 g of 1-MI and 0.12 g of PTZ. After the addition, the solution was heated to 80° C. and stirred for 8 hours. Then, P10 was obtained.

Example 11

Synthesis of isocyanate-modified polyimide (P11)

To weighed 126.9 g (0.2 mol) of DA4 and 40.05 g (0.2 mol) of ODA, 550 mL of DMAC was added. The mixture was stirred at room temperature for 1 hour, and then successively heated to 50° C. and stirred for 4 hours. After 4 hours, 50 mL of toluene was added. The resulting solution was dehydrated with the Dean-Stark apparatus at 130° C. After the dehydration was complete, the solution was cooled to room temperature followed by the addition of 14 g (0.1 mol) of 2-IEA, 0.1 g of 1-MI and 0.12 g of PTZ. After the addition, the solution was heated to 80° C. and stirred for 8 hours. Then, P11 was obtained.

Example 12

Synthesis of isocyanate-modified polyimide (P12)

To weighed 115.7 g (0.2 mol) of DA4 and 40.05 g (0.2 mol) of ODA, 550 mL of DMAC was added. The mixture was stirred at room temperature for 1 hour, and then successively heated to 50° C. and stirred for 4 hours. After 4 hours, 50 mL of toluene was added. The resulting solution was dehydrated with the Dean-Stark apparatus at 130° C. After the dehydration was complete, the solution was cooled to room temperature followed by the addition of 7 g (0.05 mol) of 2-IEA, 0.05 g of 1-MI and 0.06 g of PTZ. After the addition, the solution was heated to 80° C. and stirred for 8 hours. Then, P12 was obtained.

Example 13

Synthesis of isocyanate-modified polyimide (P13)

To weighed 57.85 g (0.1 mol) of DA4, 44.42 g(0.1 mol) of 6FDA and 40.05 g (0.2 mol) of ODA, 500 mL of DMAC was added. The mixture was stirred at room temperature for 1 hour, and then successively heated to 50° C. and stirred for 4 hours. After 4 hours, 50 mL of toluene was added. The resulting solution was dehydrated with the Dean-Stark apparatus at 130° C. After the dehydration was complete, the solution was cooled to room temperature followed by the addition of 7 g (0.05 mol) of 2-IEA, 0.05 g 1-MI and 0.06 g of PTZ. After the addition, the solution was heated to 80° C. and stirred for 8 hours. Then, P13 was obtained.

Example 14

Synthesis of isocyanate-modified polyimide (P14)

To weighed 63.45 g (0.1 mol) of DA5, 44.42 g(0.1 mol) of 6FDA and 40.05 g (0.2 mol) of ODA, 500 mL of DMAC was added. The mixture was stirred at room temperature for 1 hour, and then successively heated to 50° C. and stirred for 4 hours. After 4 hours, 50 mL of toluene was added. The resulting solution was dehydrated with the Dean-Stark apparatus at 130° C. After the dehydration was complete, the solution was cooled to room temperature followed by the addition of 7 g (0.05 mol) of 2-IEA, 0.05 g of 1-MI and 0.06 g of PTZ. After the addition, the solution was heated to 80° C. and stirred for 8 hours. Then, P14 was obtained.

The invention claimed is:

1. A photosensitive polyimide having a structure represented by formula (I):

formula (I)

wherein

B and D are the same or different, and each independently is a divalent organic group;

A is a tetravalent organic group containing at least one modifying group R', J is a tetravalent organic group without a modifying group R', n is an integer of greater than 0, and m is an integer of greater than 0, R' is a group selected from:

wherein R is a vinyl-containing unsaturated group or a group selected from:

wherein

R1 is a substituted or unsubstituted C1-C20 saturated or unsaturated organic group; and R2 is a vinyl-containing unsaturated group.

2. The photosensitive polyimide according to claim 1, wherein the vinyl-containing unsaturated group is selected from the following groups:

wherein each of R4 and R5 is independently H or a substituted or unsubstituted C1-C5 alkyl group, and R6 is a covalent bond or a substituted or unsubstituted C1-C20 organic group.

3. The photosensitive polyimide according to claim 1, wherein the vinyl-containing unsaturated group is selected from the following groups:
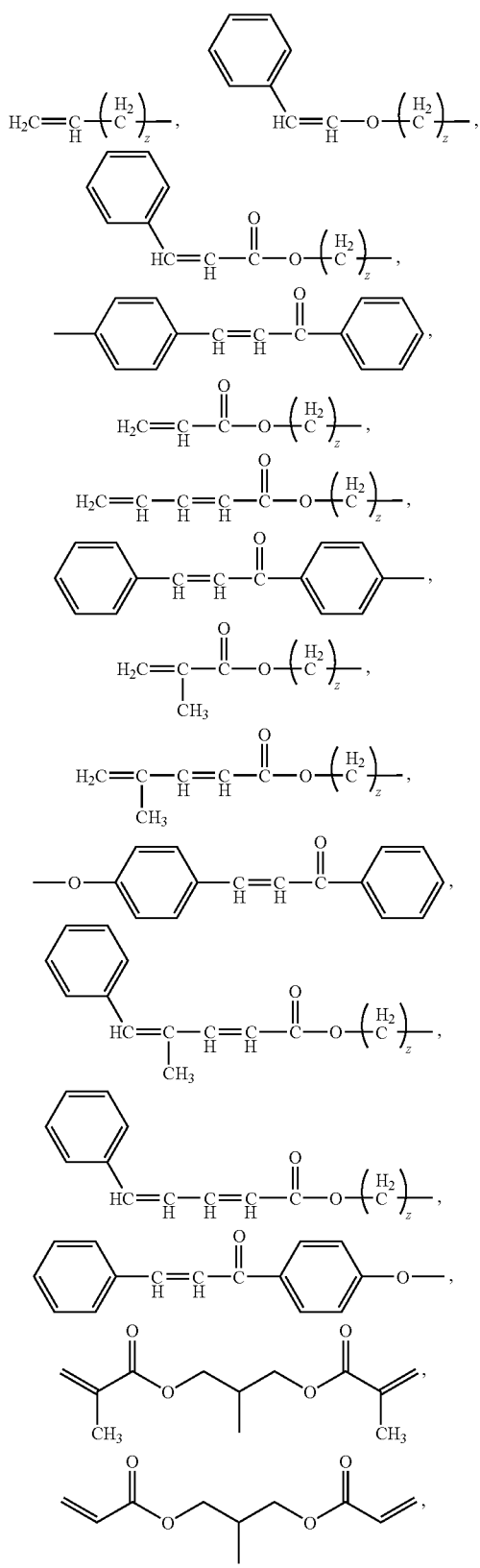
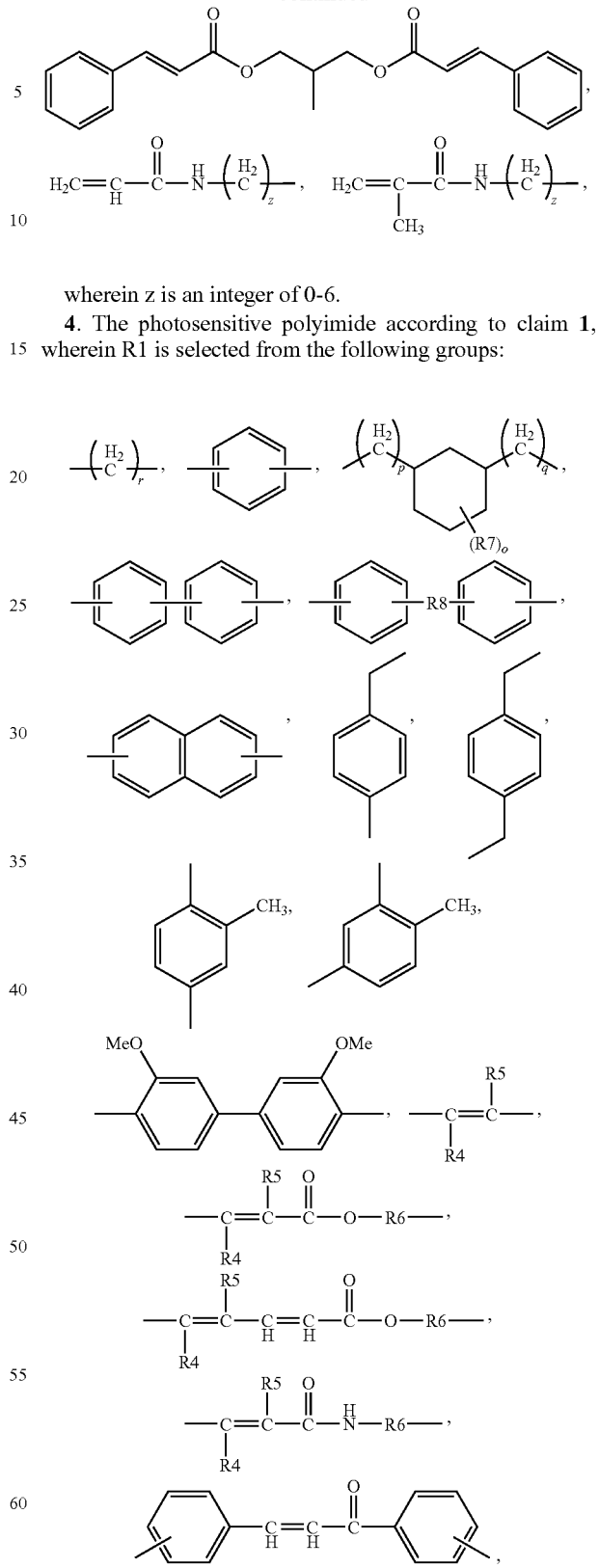
wherein z is an integer of 0-6.
4. The photosensitive polyimide according to claim 1, wherein R1 is selected from the following groups:
wherein
o, p, q and r are each independently an integer of 0 or greater than 0;

each of R4 and R5 is independently H or a substituted or unsubstituted C1-C5 alkyl group;

R6 is a covalent bond or a substituted or unsubstituted C1-C20 organic group;

R7 is H or a substituted or unsubstituted C1-C12 organic group; and

R8 is a covalent bond or an organic group selected from:

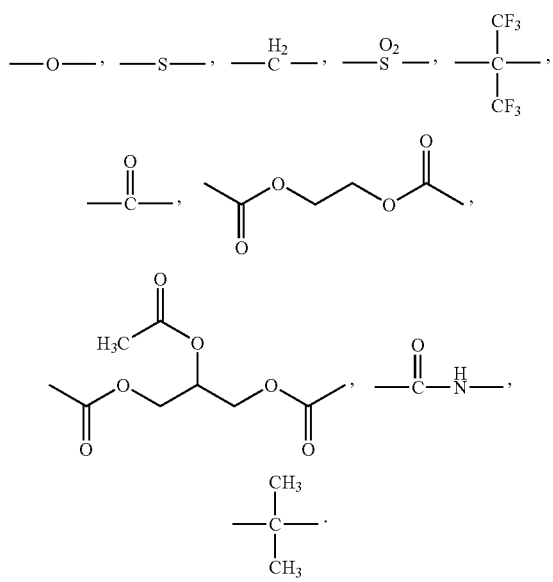

5. The photosensitive polyimide according to claim 4, wherein R1 is a group selected from:

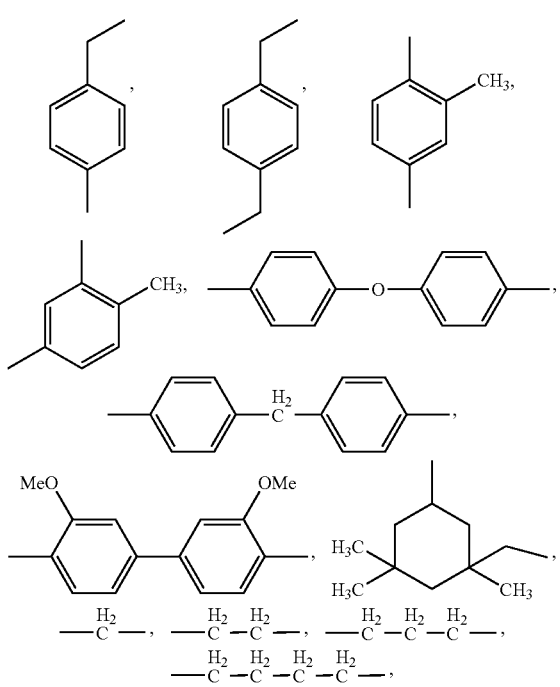

6. The photosensitive polyimide according to claim 1, wherein A is selected from the group consisting of:

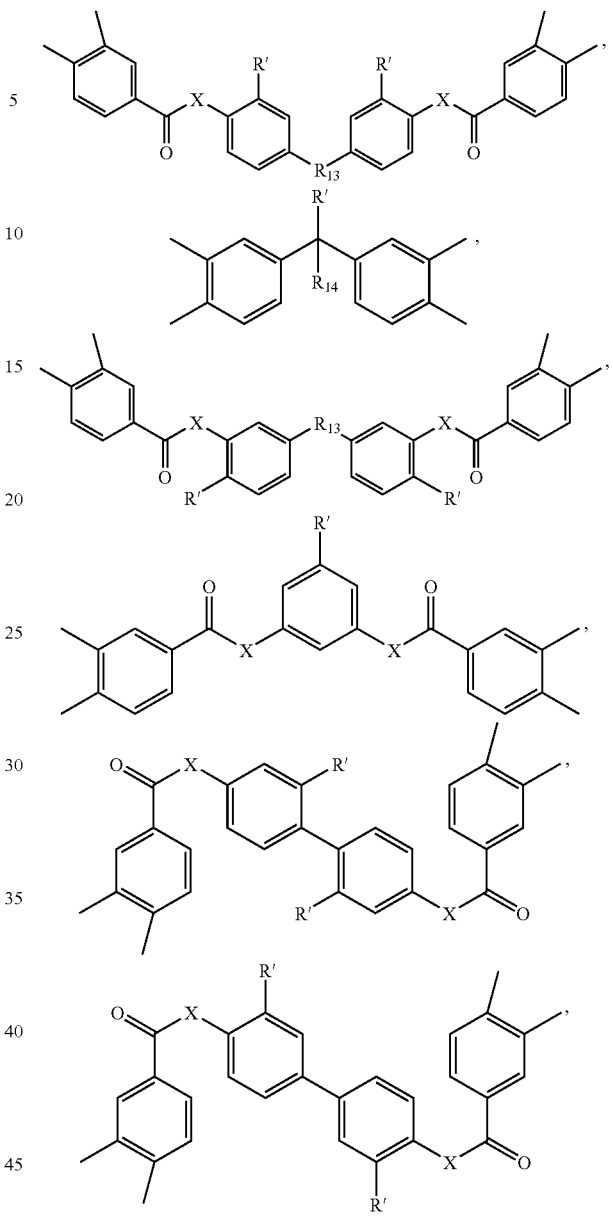

wherein

R' has the same meaning as defined in claim 1;

$R_{13}$ is —$CH_2$—, —O—, —S—, —CO—, —$SO_2$—, —$C(CH_3)_2$— or —$C(CF_3)_2$—;

$R_{14}$ is —H or —$CH_3$—;

X is —O—, —NH— or —S—.

7. The photosensitive polyimide according to claim 1, wherein A is selected from the group consisting of:

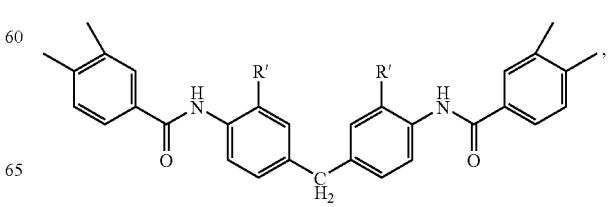

-continued
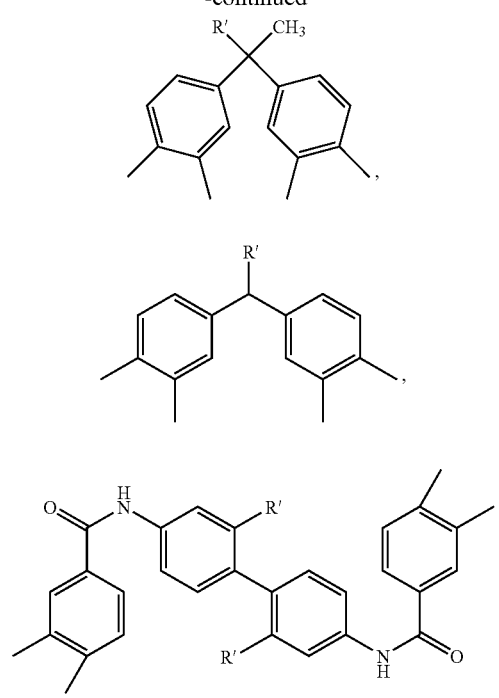
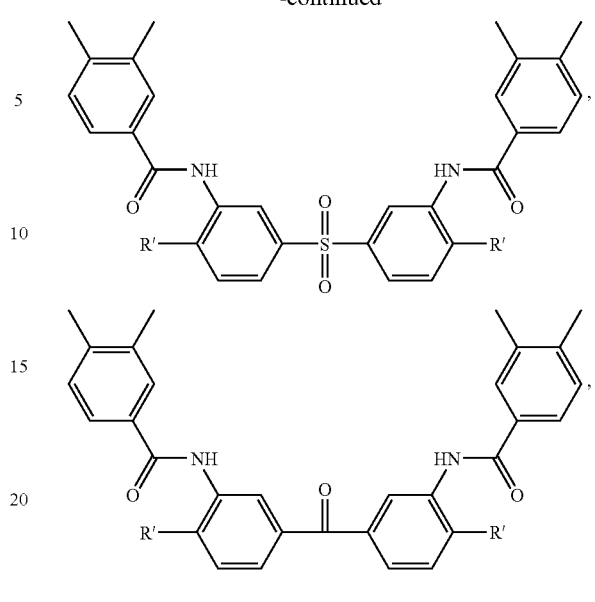
wherein R' has the same meaning as defined in claim 1.
8. The photosensitive polyimide according to claim 1, wherein J is selected from the group consisting of:
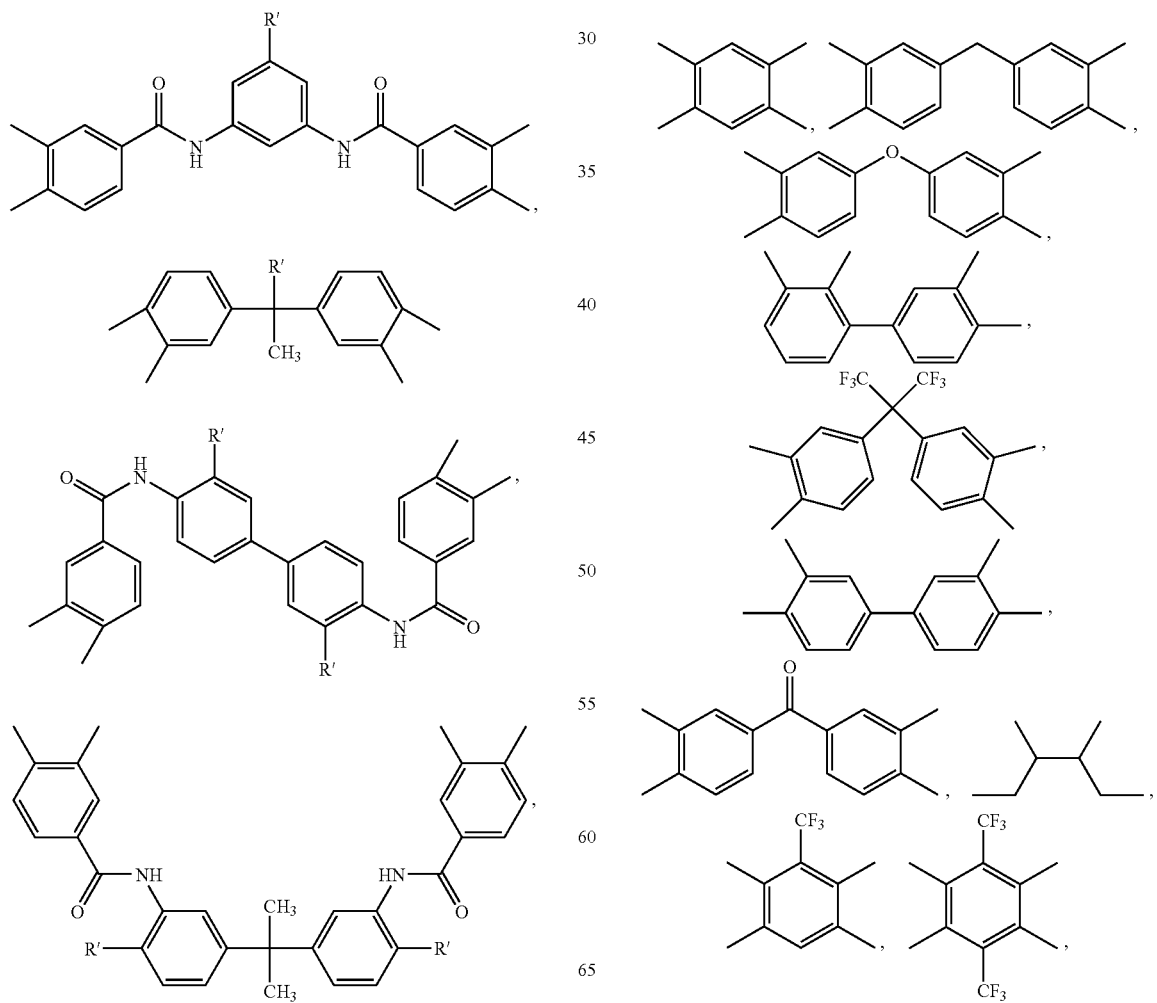

-continued
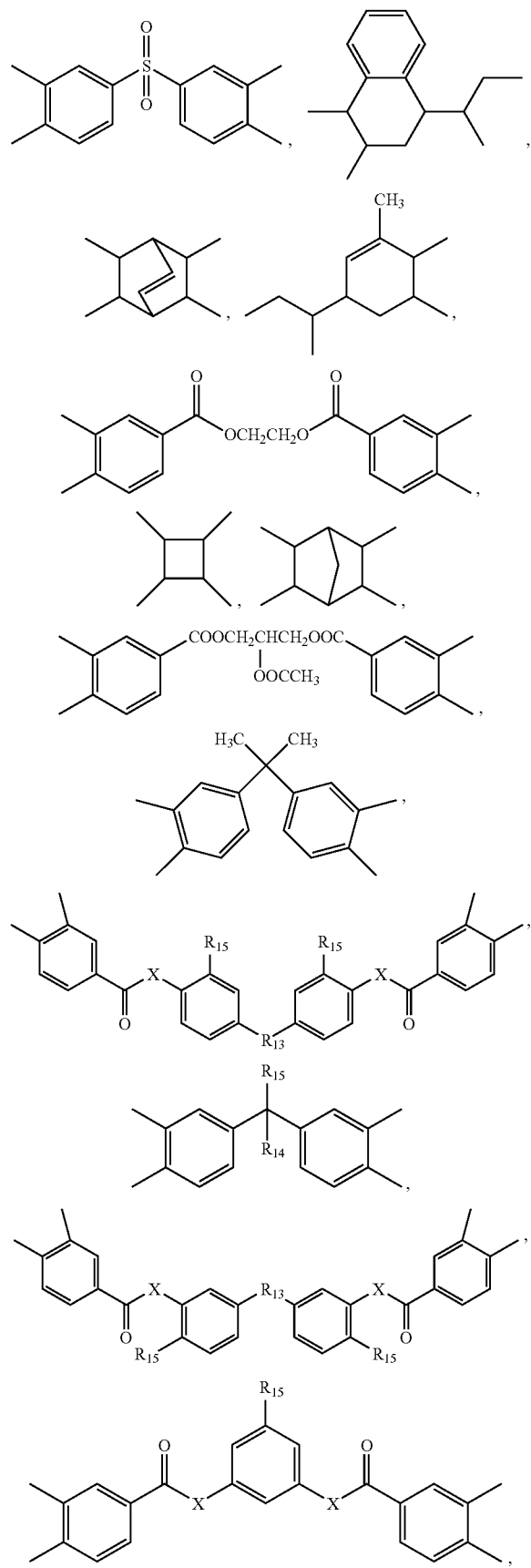
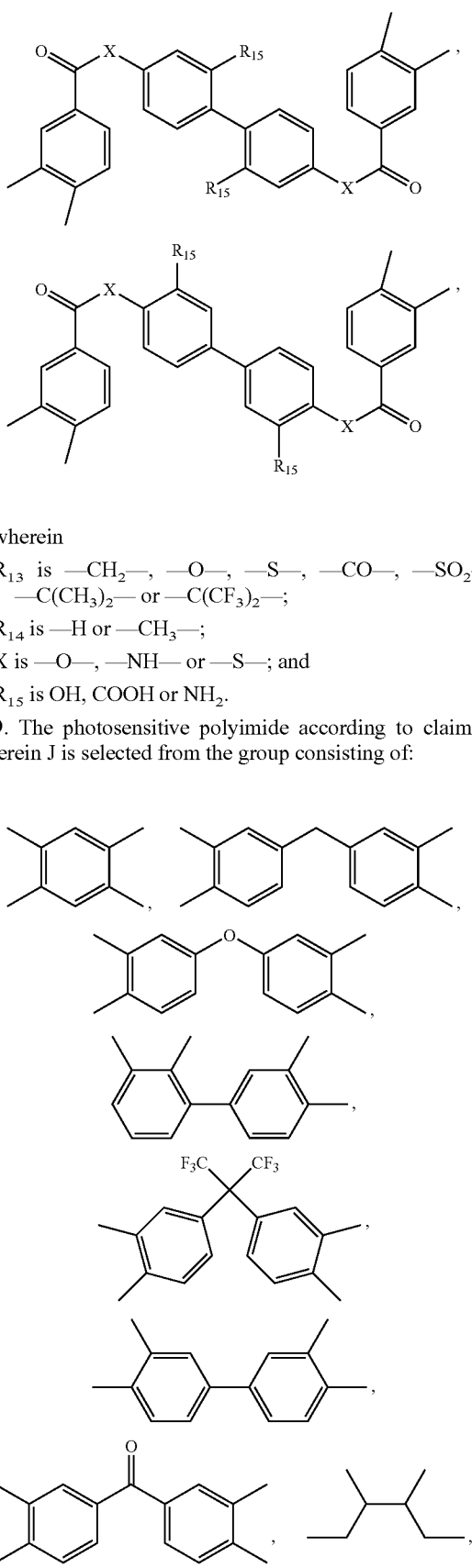
wherein
$R_{13}$ is —$CH_2$—, —O—, —S—, —CO—, —$SO_2$—, —$C(CH_3)_2$— or —$C(CF_3)_2$—;
$R_{14}$ is —H or —$CH_3$—;
X is —O—, —NH— or —S—; and
$R_{15}$ is OH, COOH or $NH_2$.
9. The photosensitive polyimide according to claim 1, wherein J is selected from the group consisting of:

49
-continued
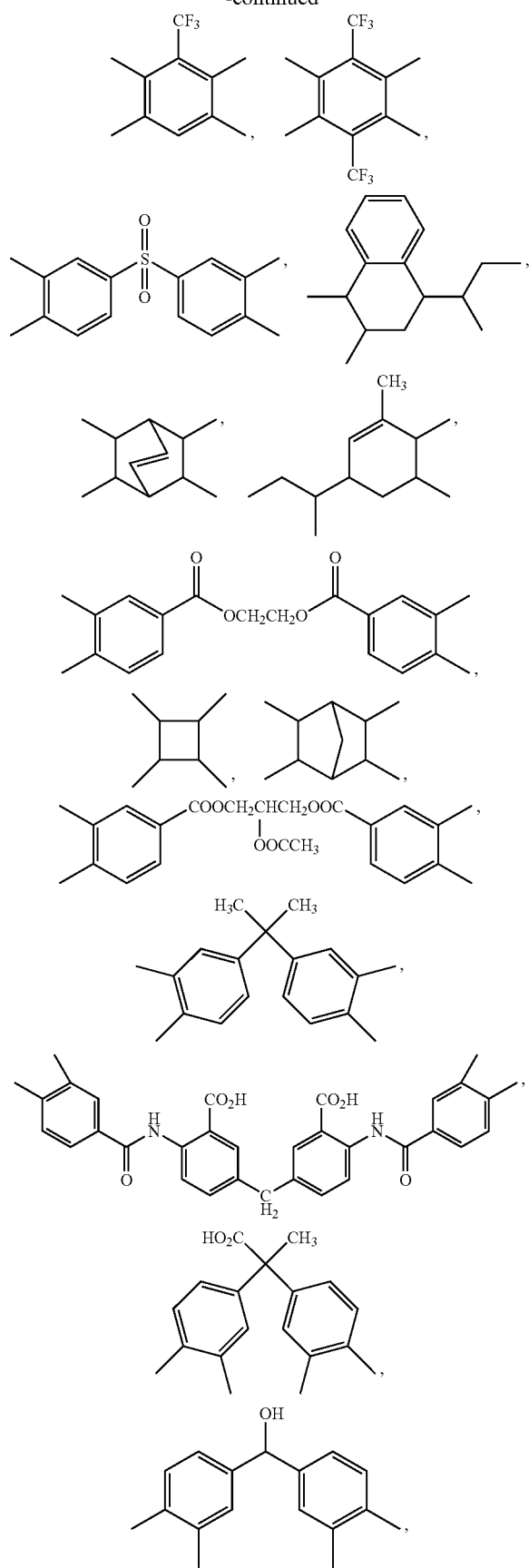
50
-continued
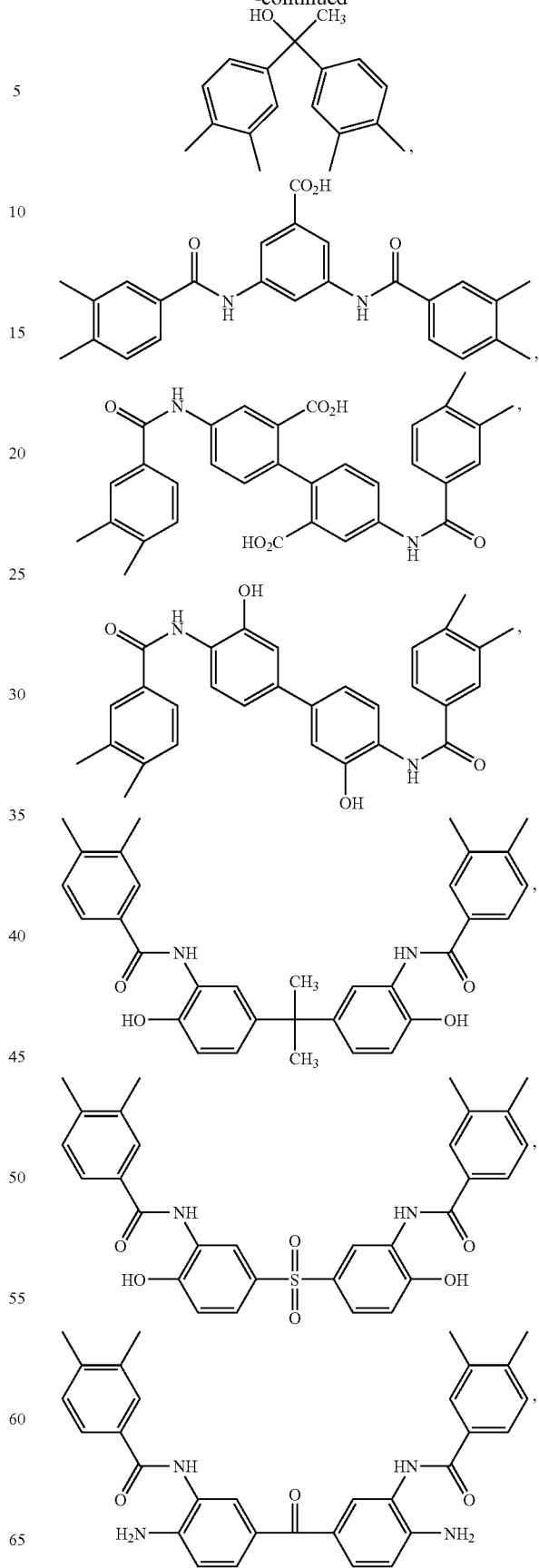

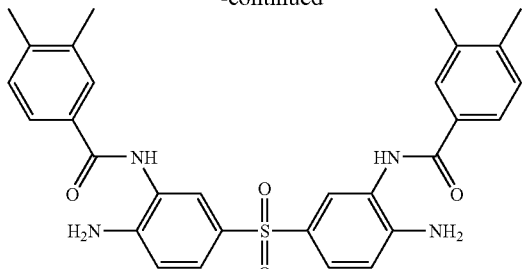

10. The photosensitive polyimide according to claim 1, wherein B and D are the divalent organic group selected from the group consisting of:

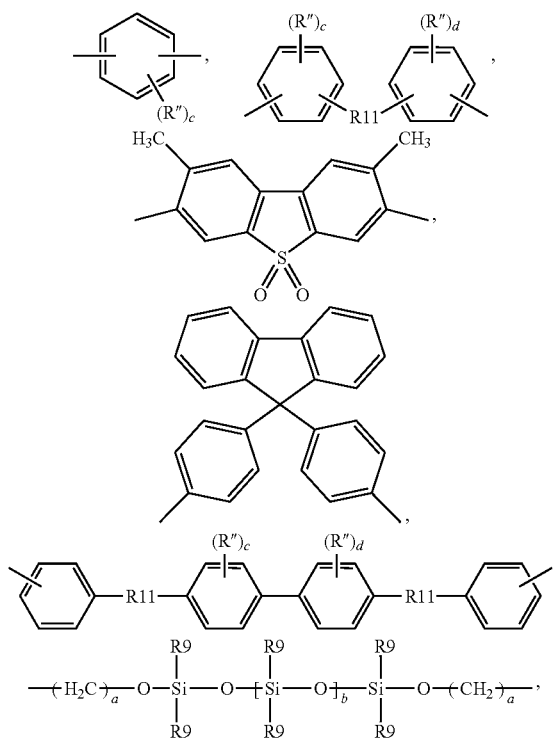

wherein
R" is —H, C1-C4 alkyl, C1-C4 perfluoroalkyl, methoxy, ethoxy, halogen, OH, COOH, $NH_2$ or SH;
R9 is H, methyl or ethyl;
c is an integer of 0-4;
d is an integer of 0-4;
a is an integer of greater than 0;
b is an integer of greater than 0; and
R11 each independently is a covalent bond or a group selected from the following groups:

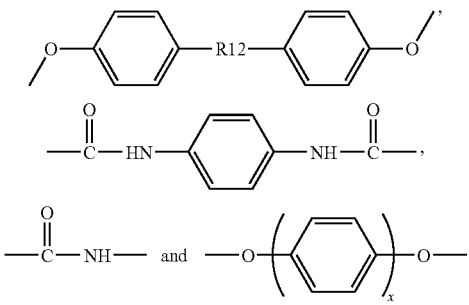

wherein
w and x are each independently an integer of greater than 0; and
R12 is —$S(O)_2$—, —C(O)—, a covalent bond or a substituted or unsubstituted C1-C18 organic group.

11. The photosensitive polyimide according to claim 1, wherein B and D are the divalent organic group selected from the group consisting of:

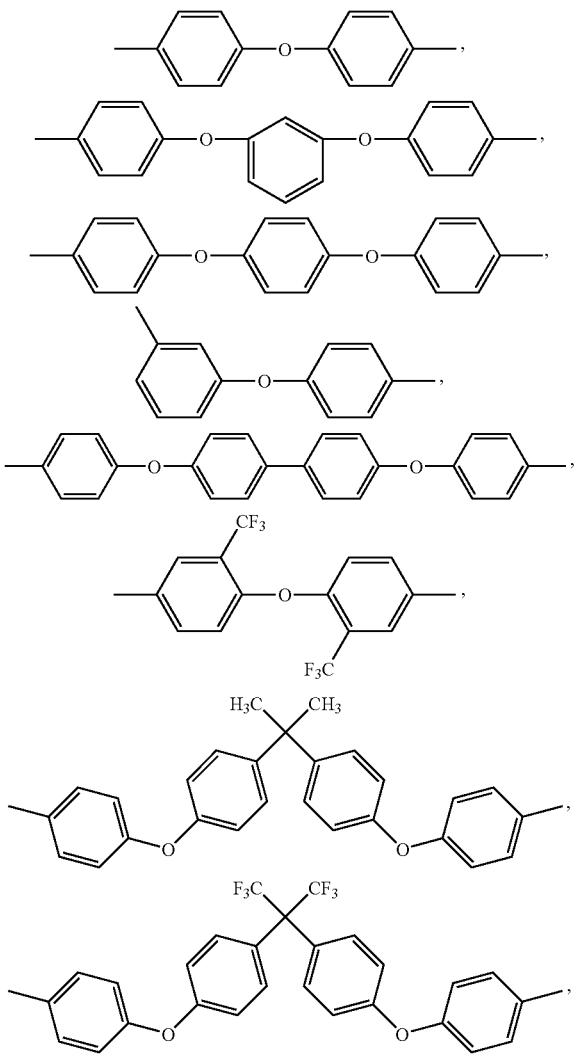

-continued

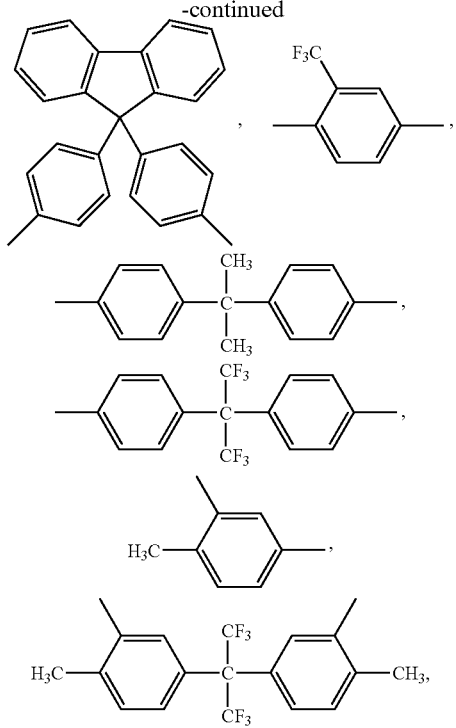

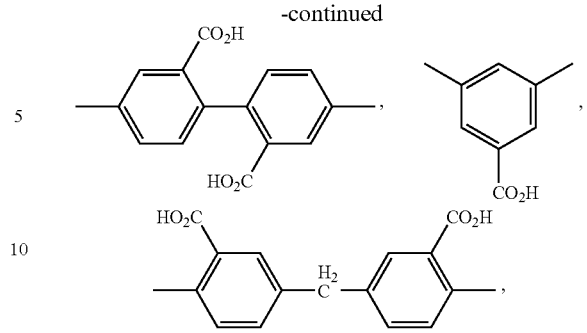

wherein y is an integer of 1-12.

12. A photosensitive composition, which comprises, based on the total weight of the composition, at least 1% by weight of the photosensitive polyimide according to claim 1 and at least one photoinitiator.

13. The photosensitive composition according to claim 12, further comprising a reactive monomer or oligomer.

14. The photosensitive composition according to claim 12 or 13, which is a liquid photo resist composition or a solid dry film photo resist composition.

* * * * *